(12) United States Patent
Chung et al.

(10) Patent No.: US 12,266,601 B2
(45) Date of Patent: Apr. 1, 2025

(54) SEMICONDUCTOR DEVICE STRUCTURE WITH BACKSIDE CONTACT

(71) Applicant: Taiwan Semiconductor Manufacturing Company, Ltd., Hsinchu (TW)

(72) Inventors: Cheng-Ting Chung, Hsinchu (TW); Yi-Bo Liao, Hsinchu (TW); Kuan-Lun Cheng, Hsin-chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 215 days.

(21) Appl. No.: 17/217,157

(22) Filed: Mar. 30, 2021

(65) Prior Publication Data
US 2022/0319981 A1   Oct. 6, 2022

(51) Int. Cl.
*H01L 23/522* (2006.01)
*H01L 21/768* (2006.01)
*H01L 29/06* (2006.01)
*H01L 29/40* (2006.01)
*H01L 29/417* (2006.01)
*H01L 29/423* (2006.01)
*H01L 29/66* (2006.01)
*H01L 29/78* (2006.01)
*H01L 29/786* (2006.01)

(52) U.S. Cl.
CPC .... *H01L 23/5226* (2013.01); *H01L 21/76897* (2013.01); *H01L 29/401* (2013.01); *H01L 29/41733* (2013.01); *H01L 29/4175* (2013.01); *H01L 29/66742* (2013.01); *H01L 29/0673* (2013.01); *H01L 29/42392* (2013.01); *H01L 2029/7858* (2013.01); *H01L 29/78696* (2013.01)

(58) Field of Classification Search
CPC ........... H01L 23/5226; H01L 21/76897; H01L 29/401; H01L 29/41733; H01L 29/4175; H01L 29/66742; H01L 29/0673; H01L 29/42392; H01L 29/78696; H01L 2029/7858
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

*Primary Examiner* — Matthew E. Gordon
*Assistant Examiner* — Sean Ayers Winters
(74) *Attorney, Agent, or Firm* — Birch, Stewart, Kolasch & Birch, LLP

(57) ABSTRACT

A semiconductor device structure is provided. The semiconductor device structure includes a fin structure formed over a substrate, and the fin structure includes a plurality of nanostructures stacked in a vertical direction. The semiconductor device structure includes a gate structure formed over the fin structure, and an S/D structure formed adjacent to the gate structure. The semiconductor device structure includes a first via formed adjacent to the S/D structure, and a first contact structure formed over the S/D structure. The semiconductor device structure includes a second contact structure formed below the S/D structure, and the first via is in direct contact with the first contact structure and the second contact structure.

20 Claims, 29 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,960,272 B1* | 5/2018 | Bao | H01L 29/66666 |
| 2014/0035109 A1* | 2/2014 | Volant | H01L 21/76802 |
| | | | 257/621 |
| 2015/0061020 A1* | 3/2015 | Yokoyama | H01L 29/785 |
| | | | 438/666 |
| 2015/0091172 A1* | 4/2015 | Ko | H01L 21/76802 |
| | | | 438/637 |
| 2016/0276478 A1* | 9/2016 | Pawlak | H01L 21/76 |
| 2018/0261685 A1* | 9/2018 | Mochizuki | H01L 29/66742 |
| 2019/0013240 A1* | 1/2019 | LiCausi | H01L 23/53228 |
| 2019/0096880 A1* | 3/2019 | Lin | H01L 21/823475 |
| 2019/0097592 A1* | 3/2019 | Goktepeli | H04B 1/0064 |
| 2019/0157148 A1* | 5/2019 | Hsieh | H01L 27/0886 |
| 2019/0157452 A1* | 5/2019 | Kim | H01L 29/4232 |
| 2019/0279981 A1* | 9/2019 | Ok | H01L 29/161 |
| 2019/0386135 A1* | 12/2019 | Li | H01L 29/66666 |
| 2019/0393318 A1* | 12/2019 | Chung | H01L 21/76834 |
| 2020/0006329 A1* | 1/2020 | Lilak | H01L 21/823418 |
| 2020/0075596 A1* | 3/2020 | Shin | H01L 29/785 |
| 2020/0105670 A1* | 4/2020 | Zhu | H01L 27/0924 |
| 2020/0144416 A1* | 5/2020 | Zhang | H01L 29/66666 |
| 2020/0185400 A1* | 6/2020 | Park | H01L 23/535 |
| 2020/0194419 A1* | 6/2020 | Jeong | H01L 23/535 |
| 2020/0294995 A1* | 9/2020 | Kim | H01L 29/7843 |

* cited by examiner

SEMICONDUCTOR DEVICE STRUCTURE WITH BACKSIDE CONTACT

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1L-2 shows a cross-sectional representation of the semiconductor device structure along line AA' shown in FIG. 1L, in accordance with some embodiments of the disclosure.

FIG. 1T-1 shows a cross-sectional representation of the semiconductor device structure along line AA' shown in FIG. 1T, in accordance with some embodiments of the disclosure.

DETAILED DESCRIPTION

Figure 1A:
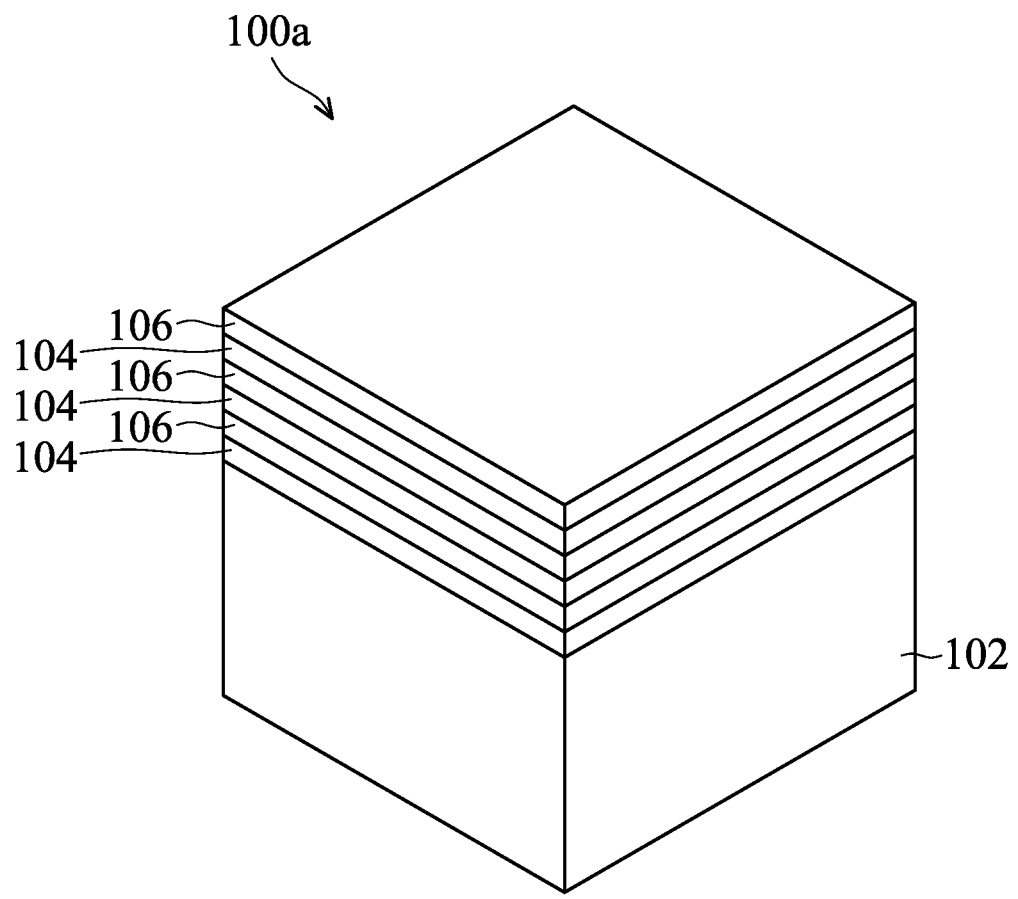
FIGS. 1A-1T show perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. FIGS. 1A-1T show perspective representations of various stages of forming a semiconductor device structure 100a, in accordance with some embodiments of the disclosure. The semiconductor device structure 100a is a gate all around (GAA) transistor structure.

As shown in FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 104 and a number of second semiconductor layers 106 are sequentially alternately formed over the substrate 102. The semiconductor layers 104 and 106 are vertically stacked to form stacked nanostructures (or stacked nanowires). It should be noted that although three layers of the first semiconductor layers 104 and three layers of the second semiconductor layers 106 are formed, the number of the first semiconductor layers 104 and the second semiconductor layers 106 can be adjusted according to the actual application.

In some embodiments, the first semiconductor layers 104 and the second semiconductor layers 106 independently include silicon (Si), germanium (Ge), silicon germanium ($Si_{1-x}Ge_x$, $0.1<x<0.7$, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 104 and the second semiconductor layer 106 are made of different materials.

The first semiconductor layers 104 and the second semiconductor layers 106 are made of different materials having different lattice constant. In some embodiments, the first semiconductor layer 104 is made of silicon (Si), and the second semiconductor layer 106 is made of silicon germanium ($Si_{1-x}Ge_x$, $0.1<x<0.7$). In some other embodiments, the first semiconductor layer 104 is made of silicon germanium ($Si_{1-x}Ge_x$, $0.1<x<0.7$), and the second semiconductor layer 106 is made of silicon (Si).

In some embodiments, the first semiconductor layers 104 and the second semiconductor layers 106 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 104 and the second semiconductor layers 106 are formed in-situ in the same chamber.

In some embodiments, the thickness of each of the first semiconductor layers 104 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 104 are substantially uniform in thickness. In some embodiments, the thickness of each of the second semiconductor layers 106 is in a range from about 1.5 nm to about 20 nm. In some embodiments, the second semiconductor layers 106 are substantially uniform in thickness.

Figure 1B:
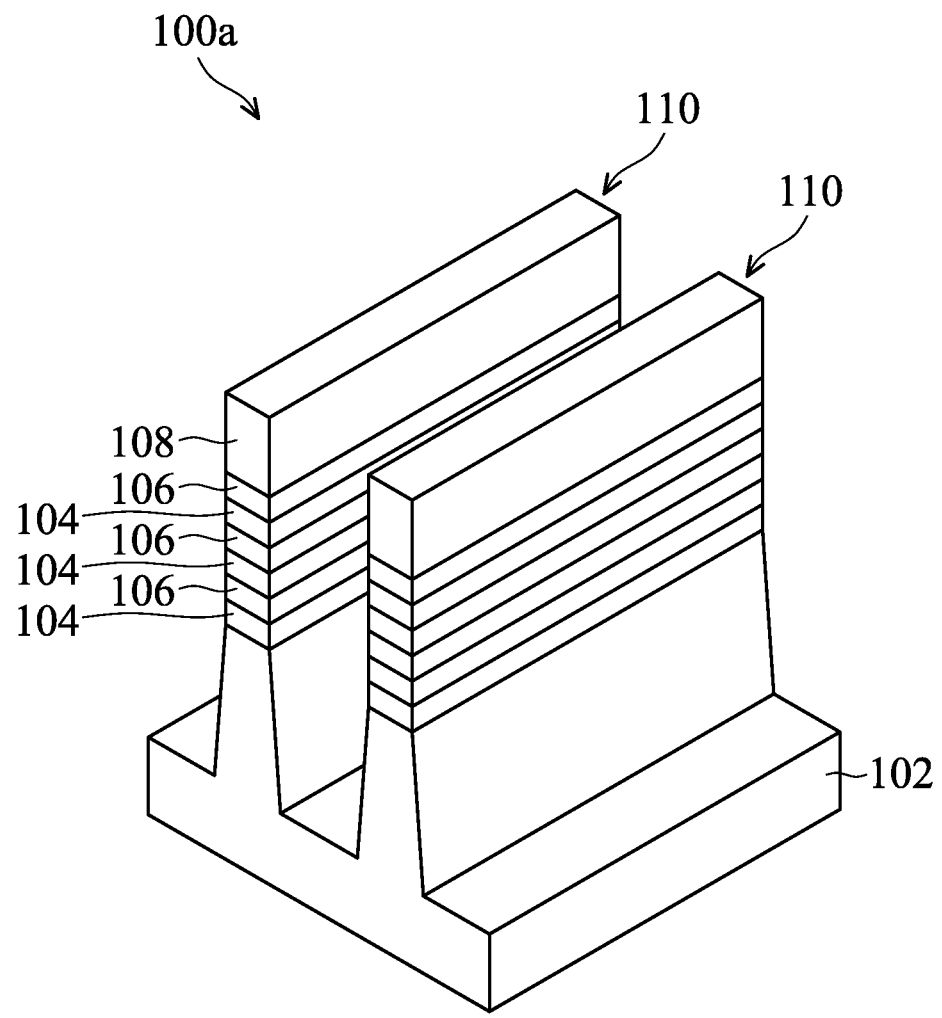
FIG. 1L-1 shows a cross-sectional representation of the semiconductor device structure along line AA' shown in FIG. 1L, in accordance with some embodiments of the disclosure.

Afterwards, as shown in FIG. 1B, a mask layer 108 is formed over the second semiconductor layer 106 and the first semiconductor layers 104 and the second semiconductor layers 106 are patterned to form a fin structure 110, in accordance with some embodiments of the disclosure. The fin structure 110 is formed by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 1C:
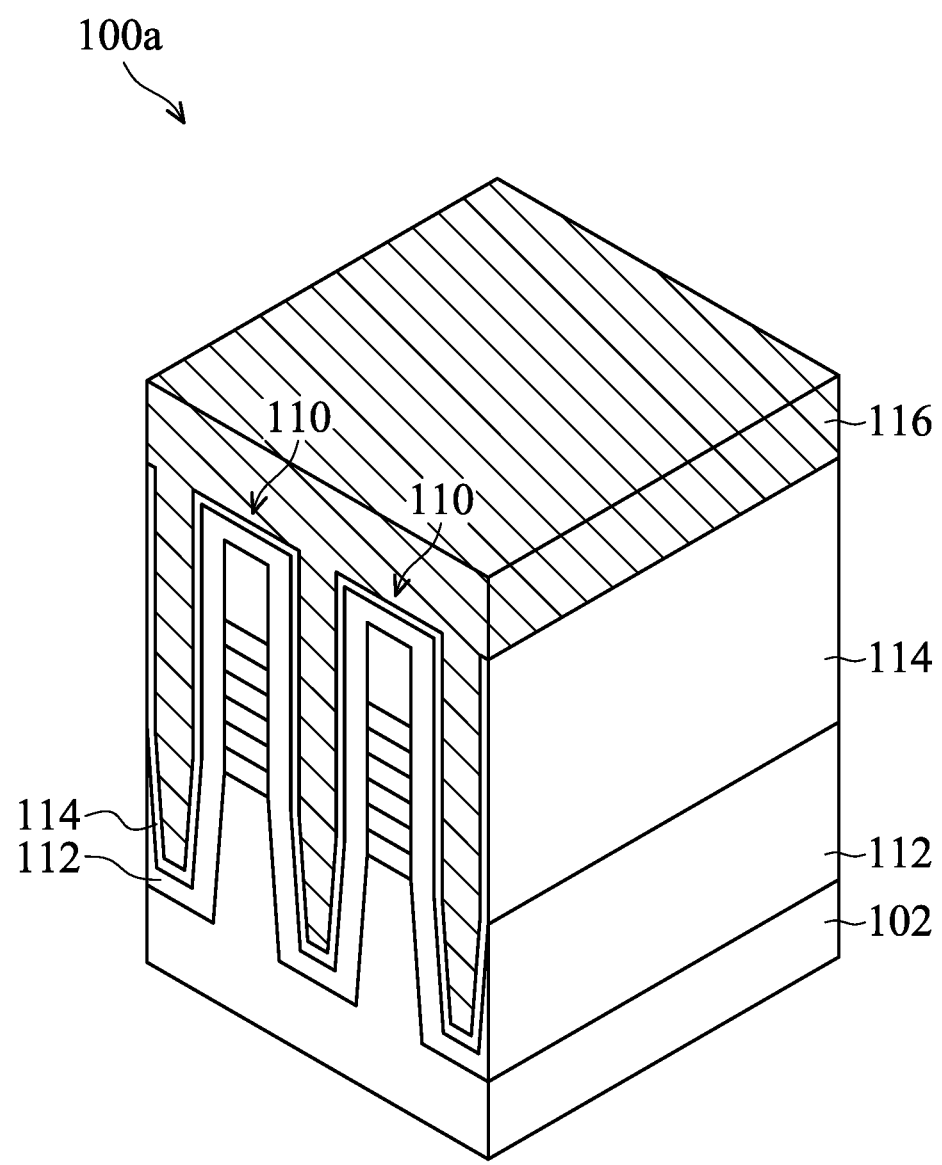

Next, as shown in FIG. 1C, a first isolation material 112 and a second isolation material 114 are sequentially formed over the fin structure 110, in accordance with some embodiments of the disclosure. Next, a conductive material 116 is formed over the second isolation material 114.

The first isolation material 112 and the second isolation material 114 are made of different material and have different etching rate. The etching selectivity of the second isolation material 114 with respect to the first isolation material 112 is relatively high. Therefore, the first isolation material 112 is removed by the etching process while the second isolation material 114 is substantially left. In some embodiments, the first isolation material 112 is made of silicon oxide (SiOx), silicon nitride (SiN), silicon carbon nitride (SiCN), silicon oxide carbonitride (SiOCN), silicon oxycarbide (SiOC) or another applicable material. In some embodiments, the second isolation material 114 is made of silicon oxide (SiOx), silicon nitride (SiN), silicon carbon nitride (SiCN), silicon oxide carbonitride (SiOCN), silicon oxycarbide (SiOC) or another applicable material.

Figure 1D:
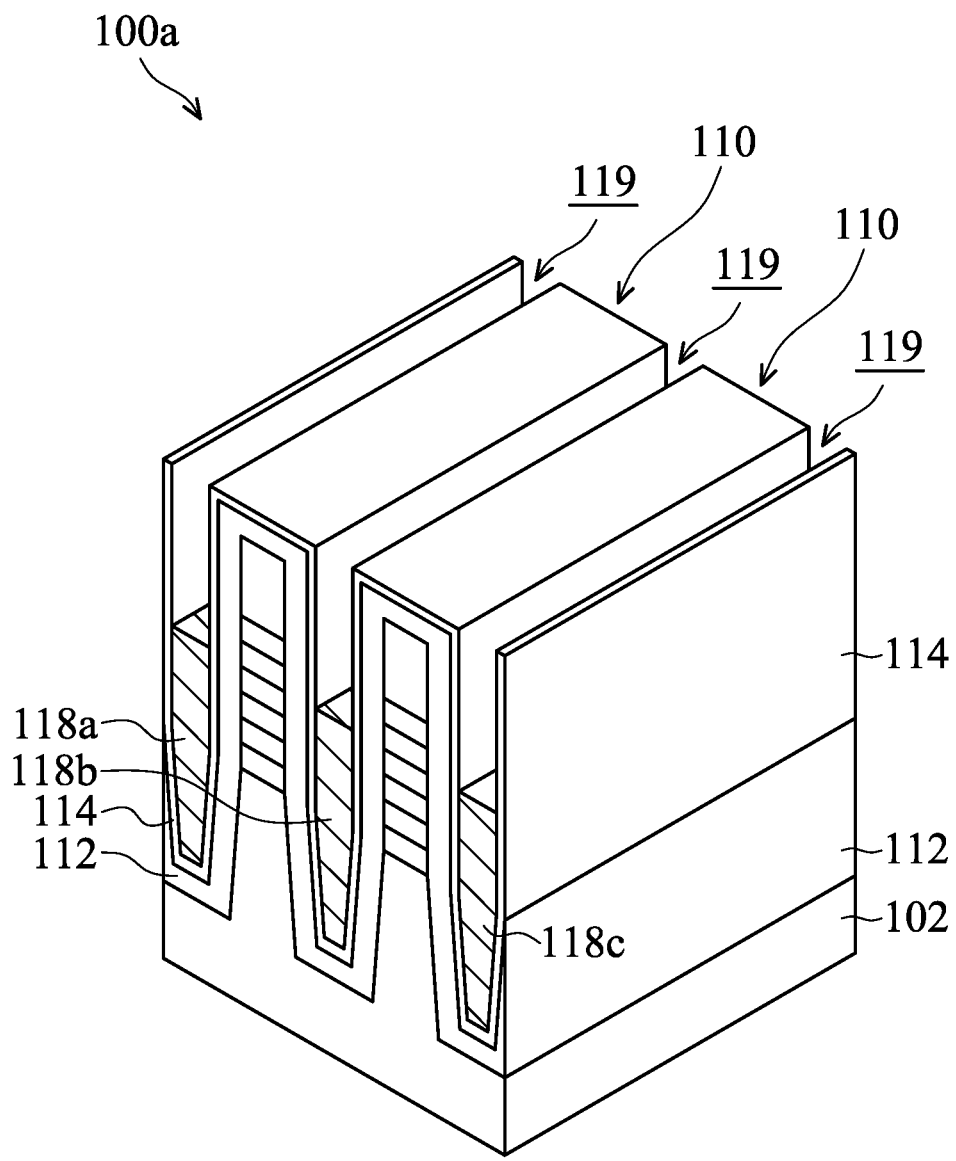

Afterwards, as shown in FIG. 1D, a portion of the conductive material 116 is removed to form a first via 118a, a second via 118b and a third via 118c, in accordance with some embodiments of the disclosure. As a result, the top surfaces of the first via 118a, the second via 118b and the third via 118c are lower than the top surface of the second isolation material 114. In addition, a first recess 119 is formed over the top surfaces of the first via 118, the second via 118b and the third via 118c.

Since the first via 118a, the second via 118b and the third via 118c are formed in the space between two adjacent fin structures 110, the positions of the first via 118a, the second via 118b and the third via 118c are self-aligned. Therefore, the first via 118a, the second via 118b and the third via 118c can also be called self-aligned vias. In addition, the first via 118a, the second via 118b and the third via 118c can also be called conductive vias. The first via 118a, the second via 118b and the third via 118c are used to provide a connection between the front side contact structure (e.g. a first contact structure 164a, FIG. 1O) to the back side contact structure (e.g. a second contact structure 174a, FIG. 1S).

In some embodiments, the portion of the conductive material 116 is removed by a planarizing process, a chemical mechanical polishing (CMP) process, and then is removed by an etching process.

Figure 1E:
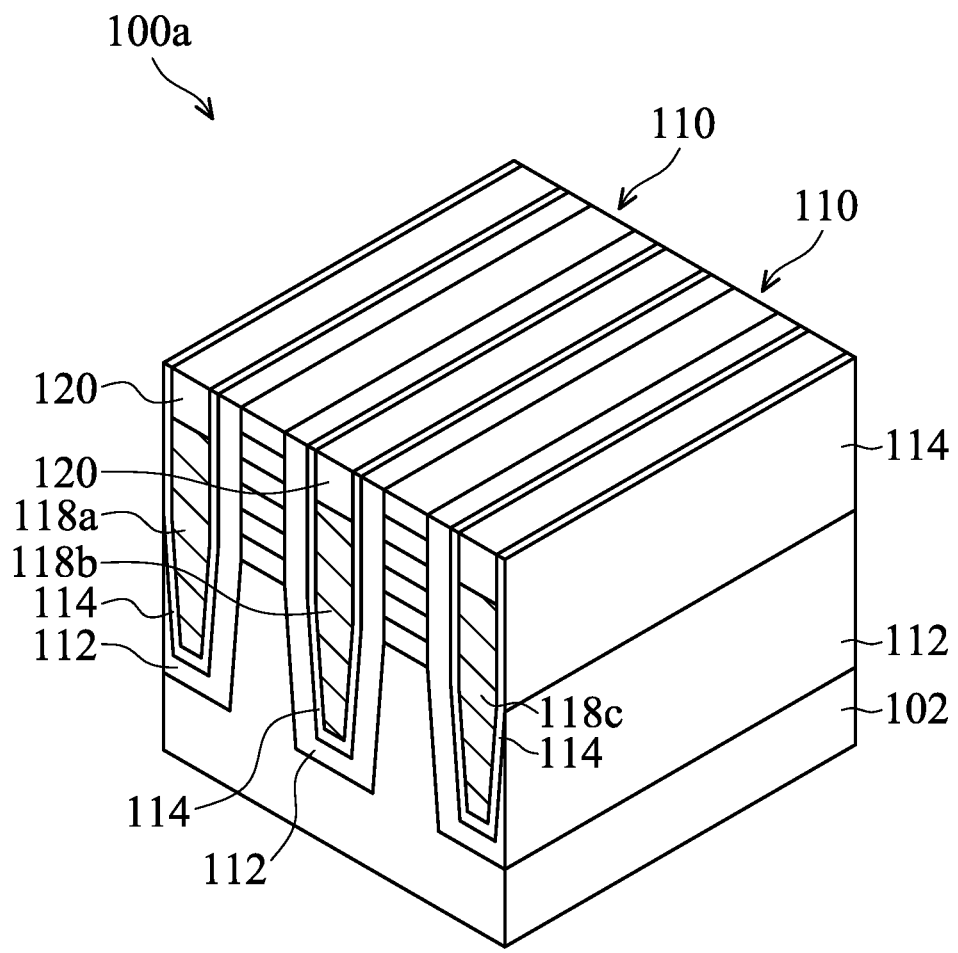

Next, as shown in FIG. 1E, a sealing layer 120 is formed in the first recess 119, and then the mask layer 108, a portion of the second isolation layer 114 and a portion of the first isolation material 112 are removed, in accordance with some embodiments of the disclosure. As a result, a top surface of the sealing layer 120 is substantially leveled with the top surface of the first isolation material 112 and the top surface of the second isolation material 114. In some embodiments, the mask layer 108, the portion of the second isolation layer 114 and the portion of the first isolation material 112 are removed by a planarizing process, a chemical mechanical polishing (CMP) process.

In some embodiments, the sealing layer 120 is made of silicon oxide ($SiO_2$), silicon nitride (SiN), silicon carbon nitride (SiCN), silicon oxide carbonitride (SiOCN), silicon oxycarbide (SiOC), hafnium dioxide ($HfO_2$) or anther applicable material.

Figure 1F:
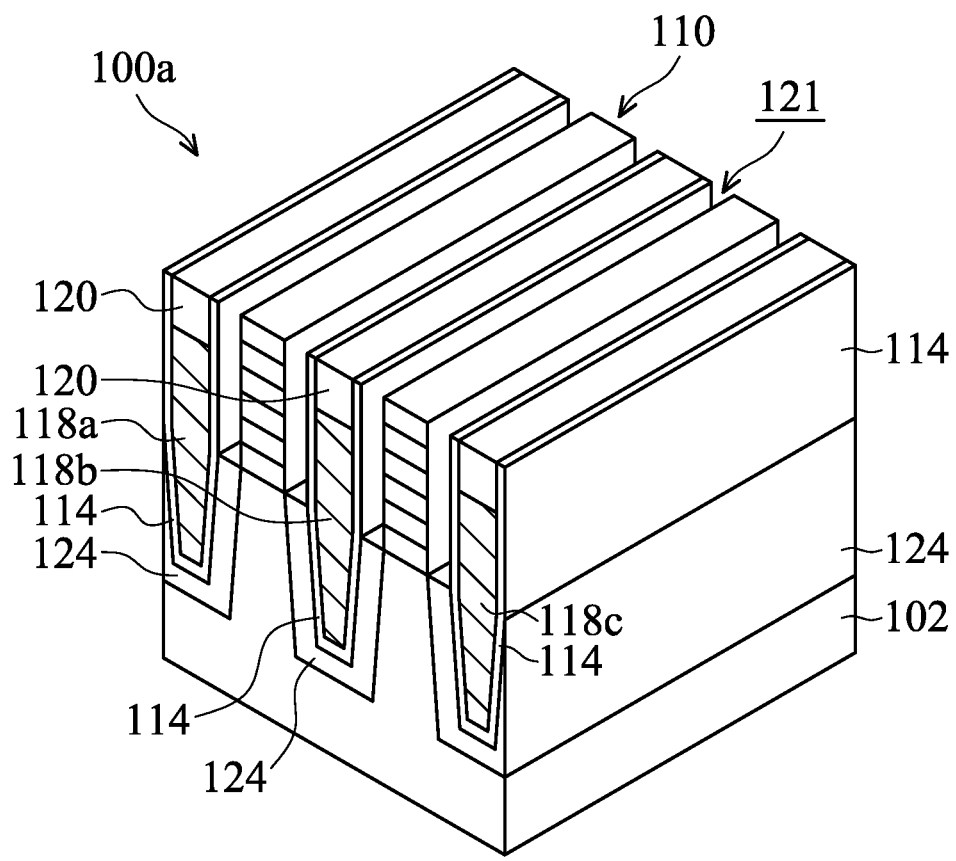

Next, as shown in FIG. 1F, a portion of the first isolation material 112 is removed to form an isolation structure 124 over the substrate 102, in accordance with some embodiments of the disclosure. Since the first isolation material 112 is different from the second isolation material 114, they have different etching selectivity. Therefore, the portion of the first isolation material 112 is removed but the second isolation material 114 is left. A second recess 121 is formed over the isolation structure 114, and the second recess 121 is between the first via 118a (or the second via 118b, or the third via 118c) and the fin structure 110. The top portions of the fin structures 110 are above the isolation structure 114. More specifically, the nanostructure including alternately stacked first semiconductor layers 104 and the second semiconductor layers 106 is above the isolation structure 114.

Figure 1G:
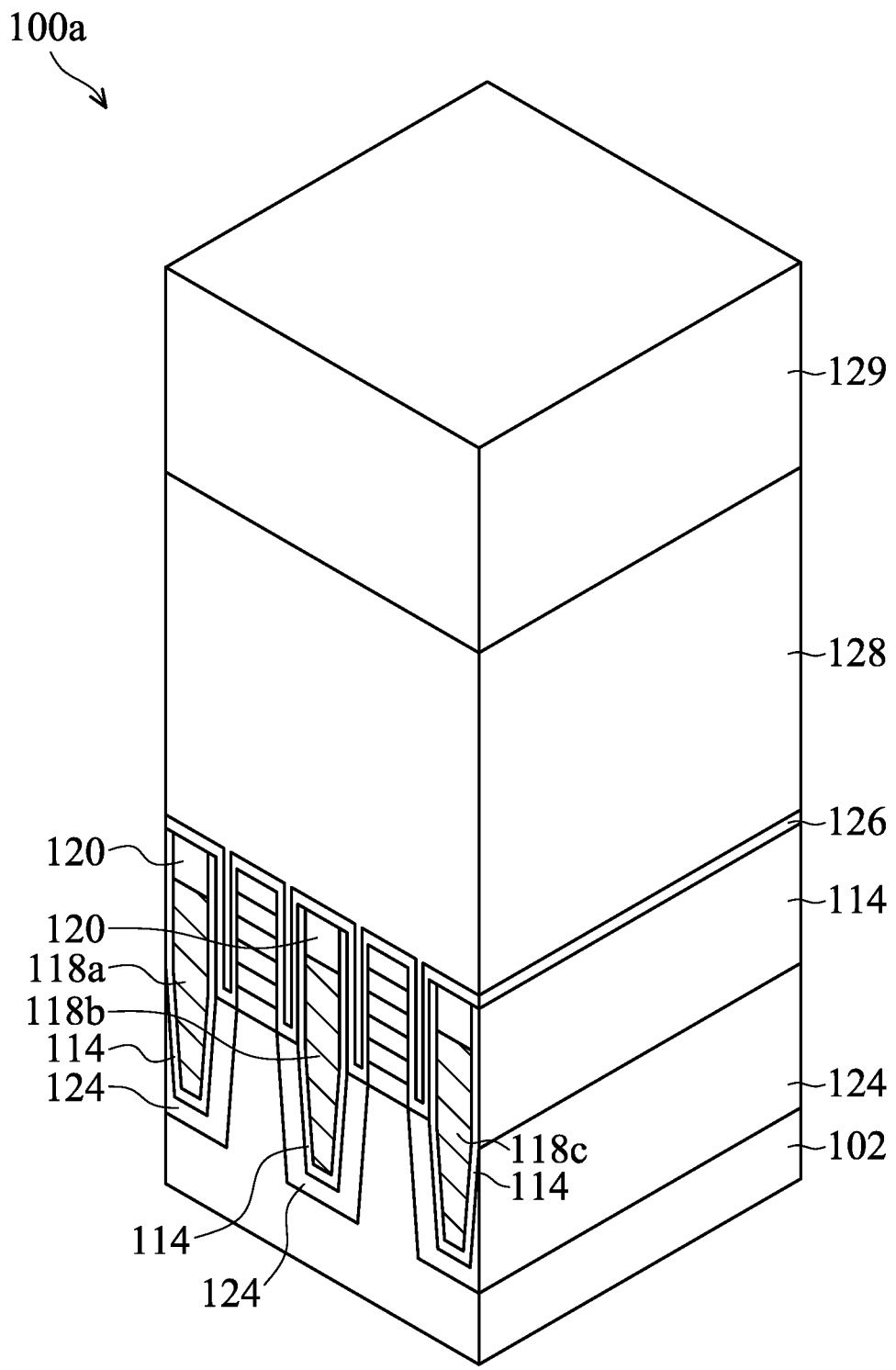

Afterwards, as shown in FIG. 1G, a dummy gate dielectric layer 126, a dummy gate electrode layer 128 and a hard mask layer 129 are sequentially formed on the fin structure 110, in accordance with some embodiments of the disclosure.

In some embodiments, the dummy gate dielectric layer 126 includes silicon dioxide, silicon nitride, a high-k dielectric material or another suitable material. In some embodiments, the dummy dielectric layer 126 is deposited by an ALD process, a CVD process, a subatmospheric CVD (SACVD) process, a flowable CVD process, a PVD process, or another suitable process.

The dummy gate electrode layer 128 is formed to partially cover and to extend across the fin structure 110. In some embodiments, the dummy gate electrode layer 128 wraps around the fin structure 110. The dummy gate dielectric layers 126 may be made of or include silicon oxide. In some embodiments, the dummy gate electrode layer 128 is made of polycrystalline-silicon (poly-Si) or poly-crystalline silicon-germanium (poly-SiGe).

Figure 1H:
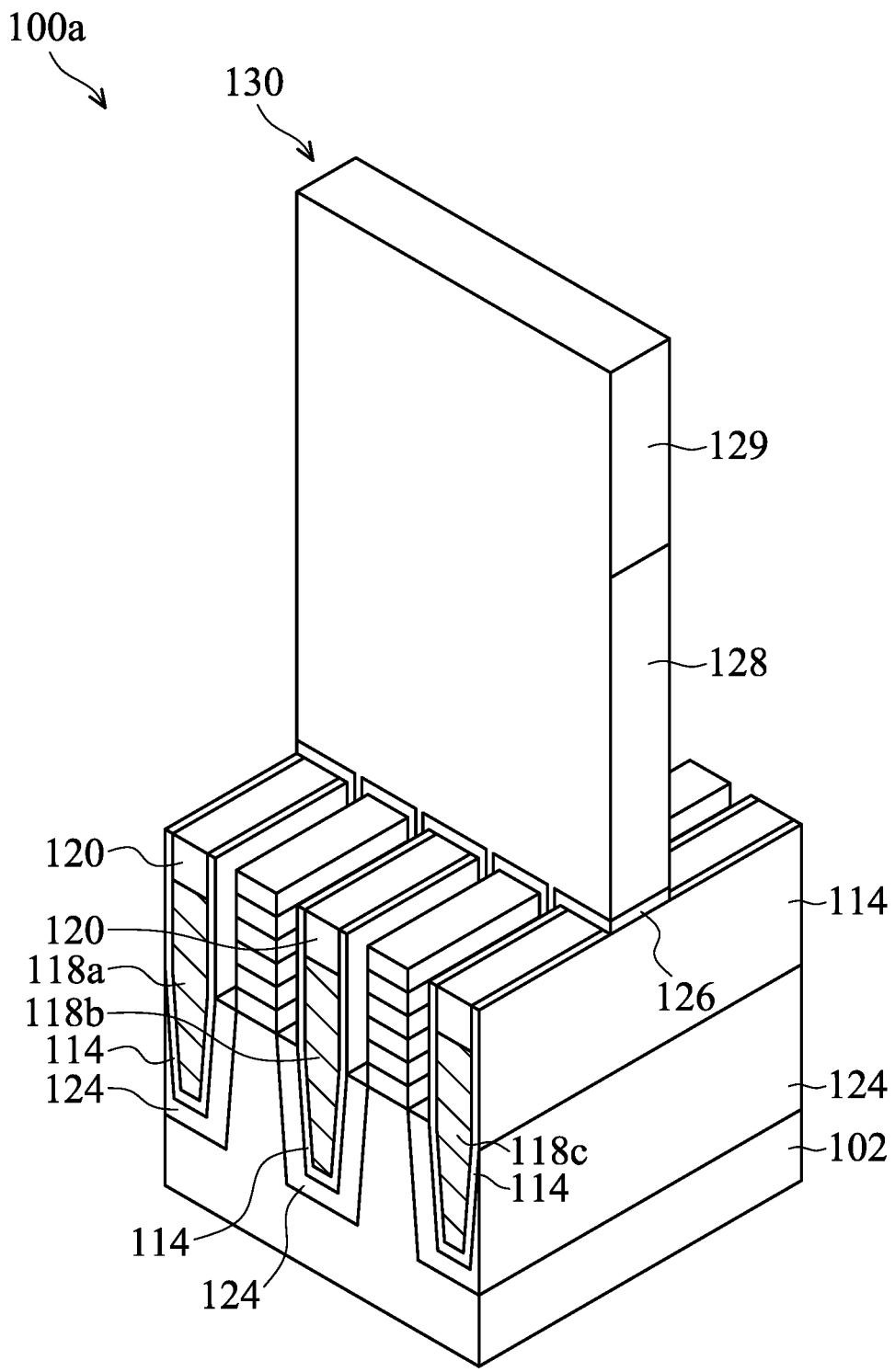

Afterwards, as shown in FIG. 1H, the dummy gate dielectric layer 126 and the dummy gate electrode layer 128 are patterned by a patterning process to form a dummy gate structure 130.

Figure 1I:
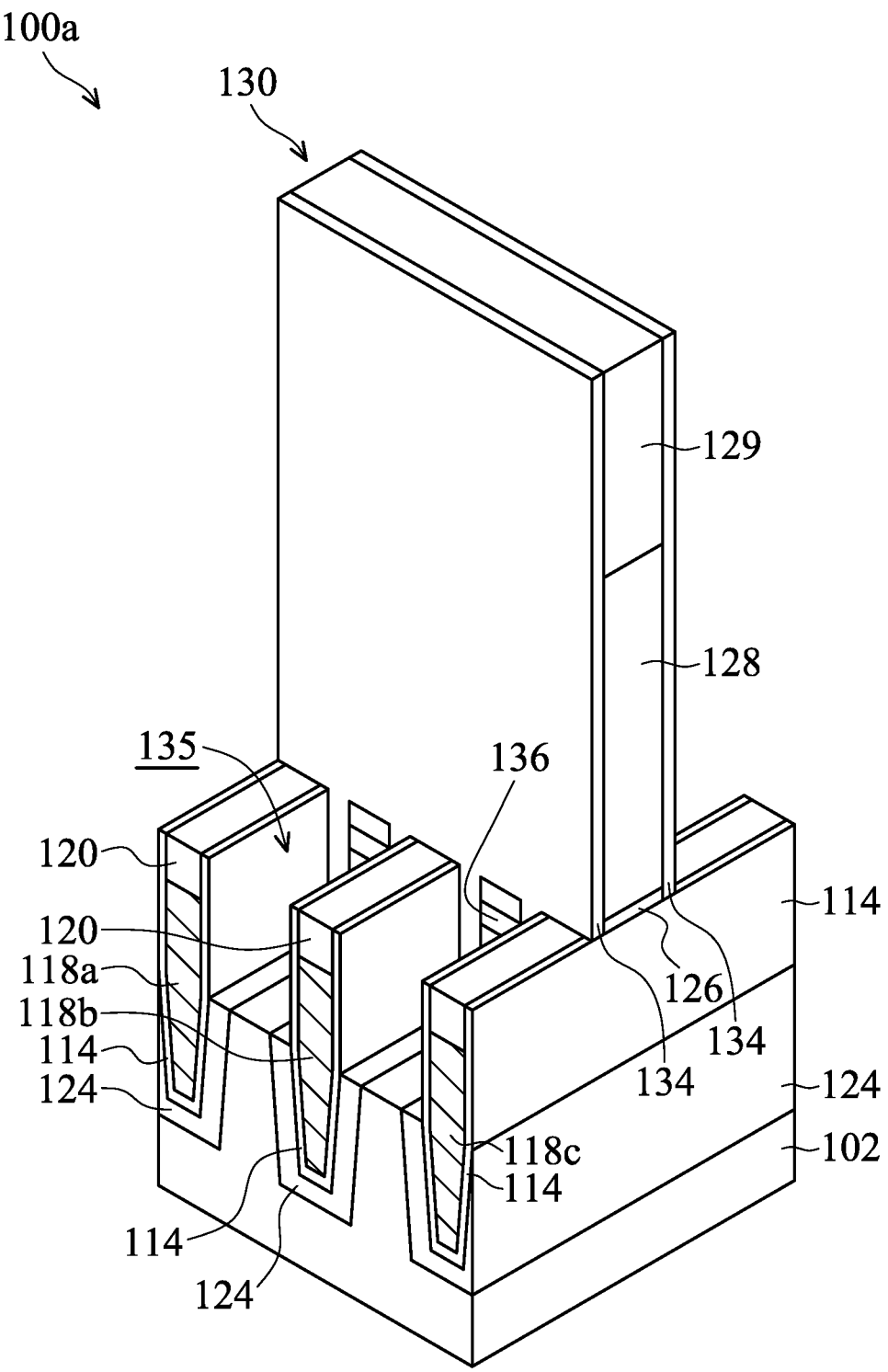

Afterwards, as shown in FIG. 1I, a gate spacer layer 134 is formed on opposite sidewall surfaces of the dummy gate electrode layer 128 and over the dummy gate dielectric layer 126, in accordance with some embodiments. The gate spacer layer 134 can provide more protection to the dummy gate structure 130 during subsequent processes.

In some embodiments, the gate spacer layer 134 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacer layer 134 is formed by a deposition process, such as CVD process, ALD process, another applicable process, or a combination thereof.

Next, a portion of the fin structure 110 is removed to form a source/drain (S/D) trench 135. In some embodiments, a portion of the first semiconductor layers 104 and a portion of the second semiconductor layer 106 are removed to form the S/D trench 135. In addition, another portion of the first semiconductor layers 104 directly underlying the gate spacer layer 134 is removed to form a number of cavities (not shown). The cavities are used to provide a space for forming an inner spacer layer 136 (formed later). Afterwards, an inner spacer material is conformally formed on the S/D trench 135 and the cavities, and a portion of the inner spacer material outside of the cavities is removed to form the inner spacer layer 116. The inner spacer layer 136 is configured to as a barrier between a first S/D structure 138a (formed later, FIG. 1J) and a gate structure 160 (formed later, as shown in FIG. 1M). The inner spacer layer 136 can reduce the parasitic capacitance between a first S/D structure 138a (formed later, FIG. 1J) and the first gate structure 160 (formed later, as shown in FIG. 1M).

The inner spacer layer 136 is directly below the gate spacer layer 134. In some embodiments, the inner spacer layer 136 is made of silicon carbon nitride (SiCN), silicon carbide (SiC), silicon oxycarbide (SiOC), silicon oxide carbonitride (SiOCN), or a combination thereof. In some embodiments, the inner spacer layer 136 is formed by a deposition process, such as CVD process, ALD process, another applicable process, or a combination thereof.

Figure 1J:
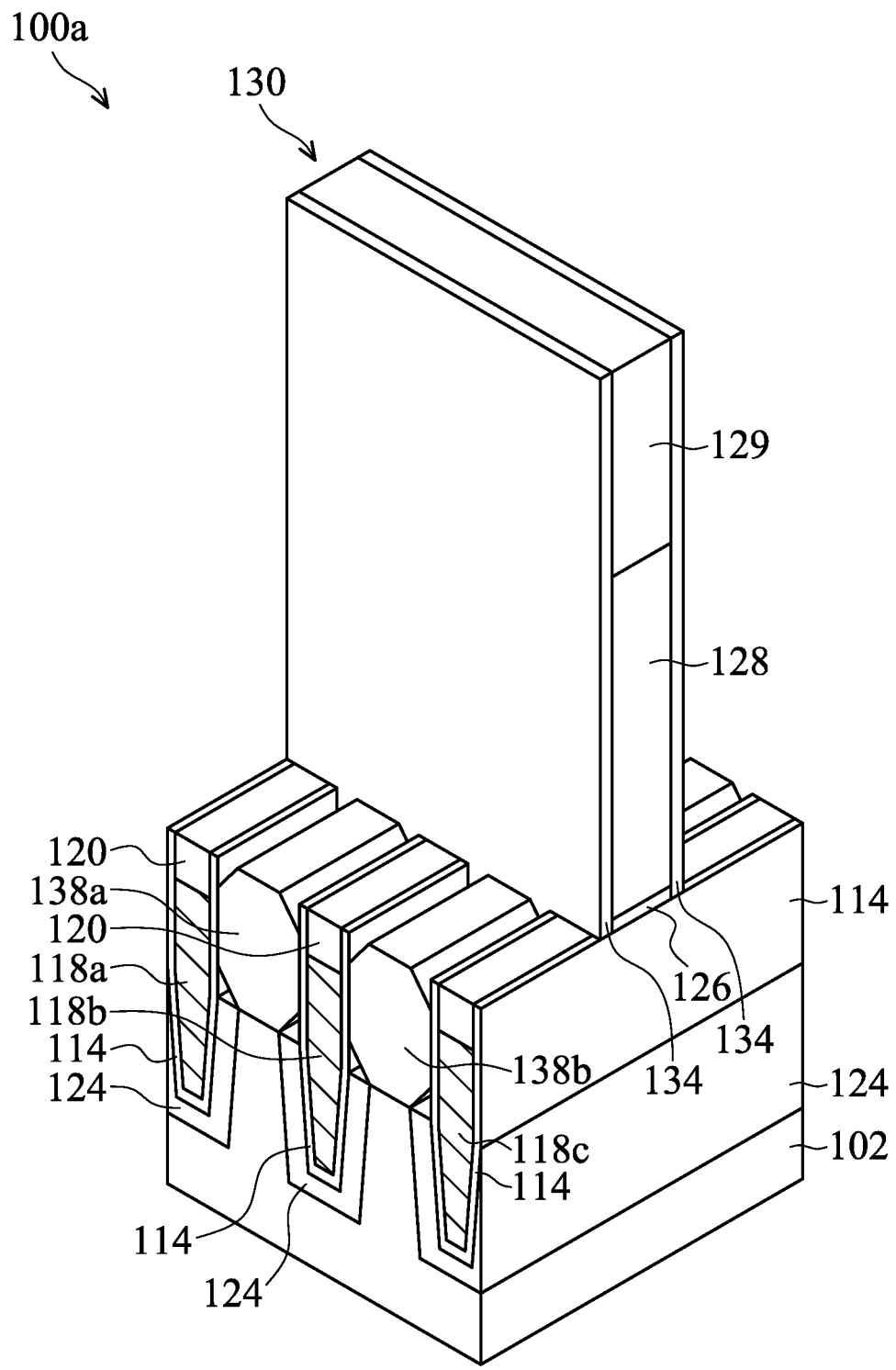

Afterwards, as shown in FIG. 1J, the first source/drain (S/D) structure 138a and a second S/D structure 138b are formed in the S/D trench 135, in accordance with some embodiments of the disclosure. The first S/D structure 138a and the second S/D structure 138b are in direct contact with the inner spacer layer 136. The first S/D structure 138a is between the first via 118a and the second via 118b. The first S/D structure 138a is separated from the first via 118a by the second isolation material 114. In addition, the first S/D structure 138a is separated from the second via 118b by the second isolation material 114. The top surface of the first S/D structure 138a is higher than the top surface of the first via 118a.

The second S/D structure 138b is between the second via 118b and the third via 118c. The second S/D structure 138b is separated from the second via 118b by the second isolation material 114. In addition, the second S/D structure 138b is separated from the third via 118c by the second isolation material 114. In some embodiments, the first S/D structure 138a is a P-type S/D structure, and the second S/D structure 138b is a N-type S/D structure.

The first S/D structure 138a and the second S/D structure 138b may include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The first S/D structure 138a and the second S/D structure 138b may doped with one or more dopants. In some embodiments, the first S/D structure 138a is silicon (Si) doped with phosphorus (P), arsenic (As), antimony (Sb), or another applicable dopant. Alternatively, the first S/D structure 138a is silicon germanium (SiGe) doped with boron (B) or another applicable dopant.

In some embodiments, the first S/D structure 138a and the second S/D structure 138b are formed by an epitaxy or epitaxial (epi) process. The epi process may include a selective epitaxial growth (SEG) process. CVD deposition techniques (e.g., vapor-phase epitaxy (VPE) and/or ultra-high vacuum CVD (UHV-CVD)), molecular beam epitaxy, or other suitable epi processes.

Figure 1K:
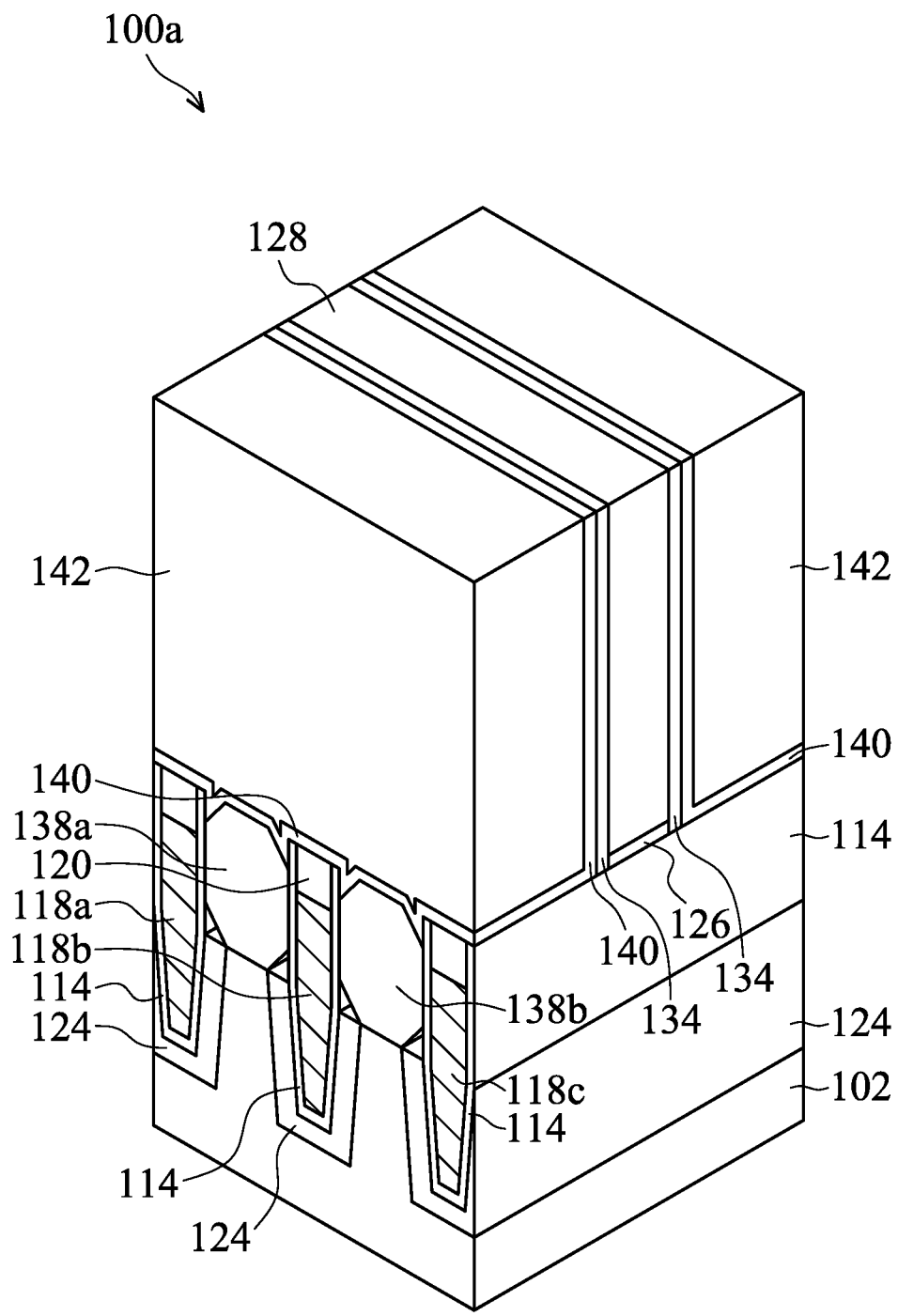

Afterwards, as shown in FIG. 1K, a contact etch stop layer (CESL) 140 is formed over the first S/D structure 138a and the second S/D structure 138b and an inter-layer dielectric (ILD) layer 142 is formed over the CESL 140, in accordance with some embodiments.

In some embodiments, the CESL 140 is made of silicon nitride, silicon oxynitride, and/or other applicable materials. The CESL 140 may be formed by plasma enhanced chemical vapor deposition (CVD) process, low pressure CVD process, atomic layer deposition (ALD) process, or another applicable processes.

The ILD layer 142 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 142 may be formed by chemical vapor deposition (CVD), physical vapor deposition, (PVD), atomic layer deposition (ALD), spin-on coating, or other applicable processes.

Figure 1L:
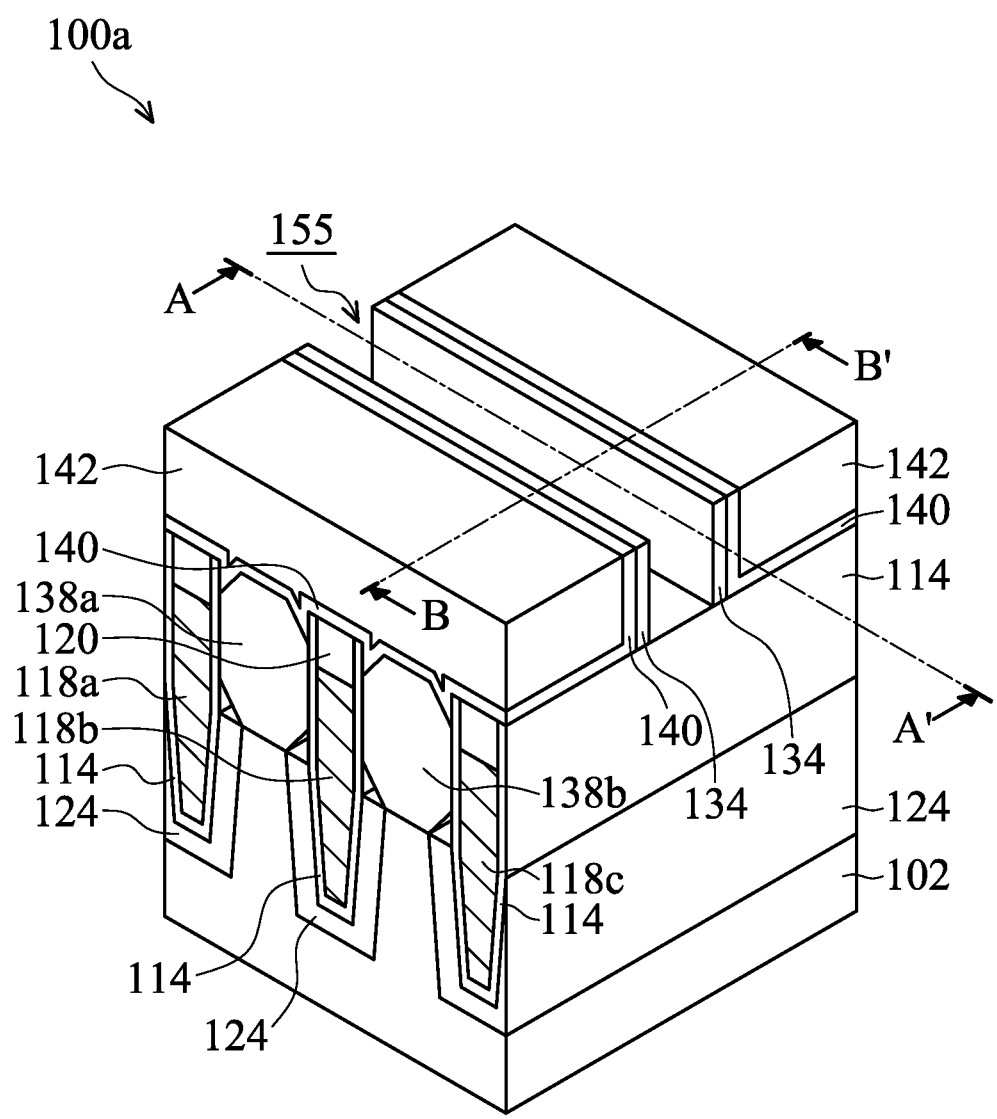

Next, as shown in FIG. 1L, the dummy gate electrode layer 128 and the dummy gate dielectric layer 126 are removed to form an opening 155. As a result, the sidewall surfaces of the gate space layer 134 are exposed. In some embodiments, the dummy gate electrode layer 128 and the dummy gate dielectric layer 126 are removed by an etching process, such as wet etching process, a dry etching process or a combination thereof.

Figures 1, 1L:
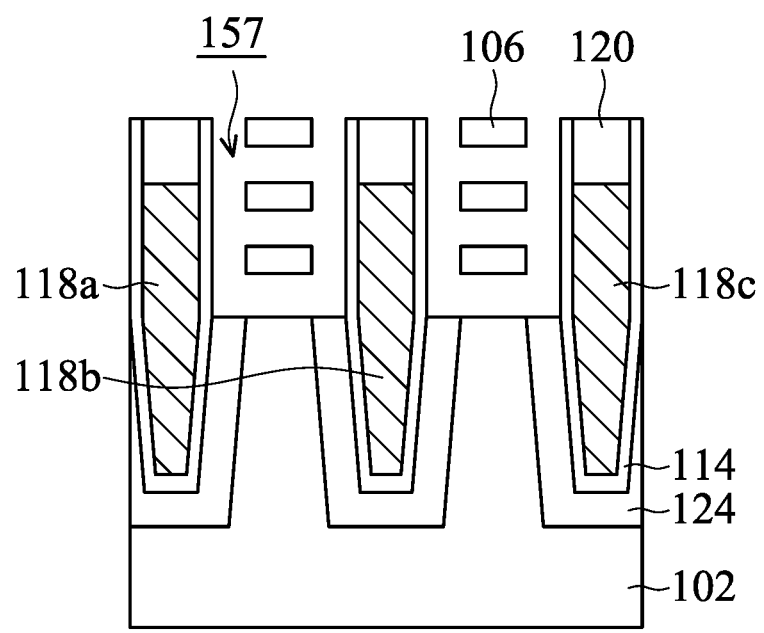

FIG. 1L-1 shows a cross-sectional representation of the semiconductor device structure 100a along line AA' shown in FIG. 1L, in accordance with some embodiments of the disclosure. As shown in FIG. 1L-1, the first semiconductor layers 104 are removed to form a number of gaps 157, in accordance with some embodiments. Each of the gaps 157 is formed between two adjacent second semiconductor layers 106. Since the first semiconductor layers 104 and the second semiconductor layers 106 are made of different materials, they have different etching selectivity. Therefore, the first semiconductor layers 104 are removed, but the second semiconductor layers 106 are left.

The remaining second semiconductor layers 106 are used to as channel region of the semiconductor device structure 100a. In some embodiments, the second semiconductor layers 106 may be referred to as "nanostructures" "nanowires", or "nanosheets". Therefore, the fin structure 110 includes a number of nanostructures stacked in a vertical direction. As shown in FIG. 1L-1, the gaps 157 are between two adjacent second semiconductor layers 106, and the gaps 157 are exposed by the opening 155.

Figures 1, 1L, 2:
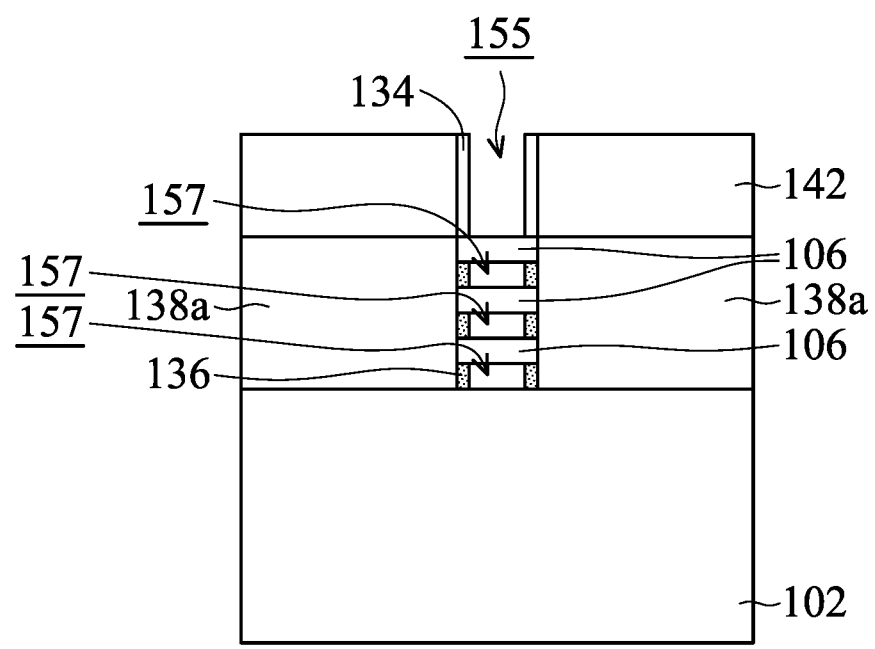
Figure 1M:
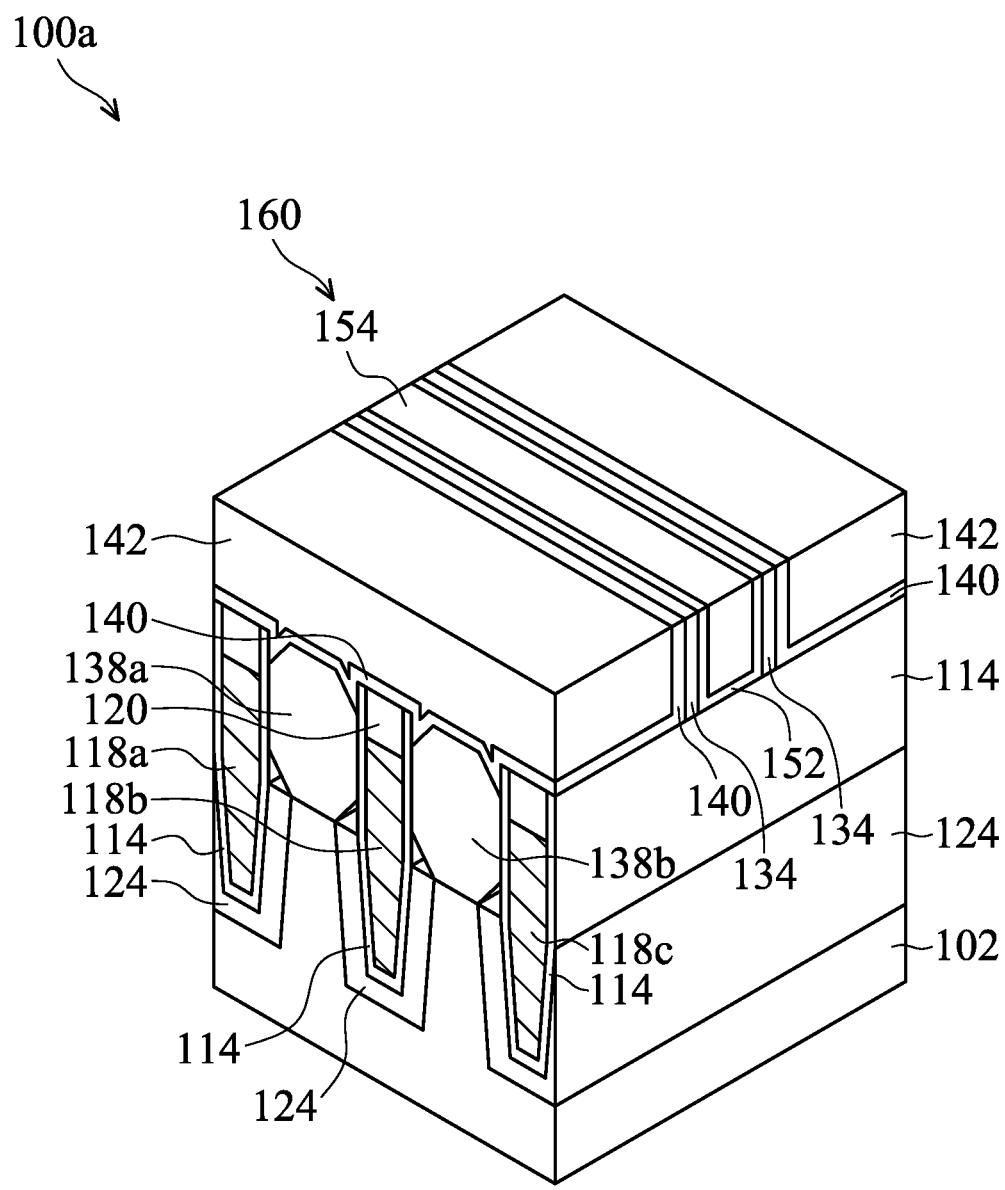

FIG. 1L-2 shows a cross-sectional representation of the semiconductor device structure 100a alone line BB' shown in FIG. 1L, in accordance with some embodiments of the disclosure. As shown in FIG. 1L-2, the inner spacer layer 136 is directly below the gate spacer layer 134. The inner spacer layer 136 is between the gap 157 and the first S/D structure 138a.

Afterwards, as shown in FIG. 1M, a gate structure 160 is formed in the opening 155 and gaps 157, in accordance with some embodiments of the disclosure. The gate structure 160 is formed over the fin structure 110. In some embodiments, the gate structure 160 includes a gate dielectric layer 152 and a gate electrode layer 154. Each of the second semiconductor layers 106 is surrounded by the multiple layers of the gate structure 160. In some embodiments, the gate dielectric layer 152 is a high-k dielectric layer. In some embodiments, the high-k gate dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the gate dielectric layer 152 is formed using chemical vapor deposition (CVD), atomic layer deposition (ALD), another suitable method, or a combination thereof.

In some embodiments, the gate electrode layer 154 includes a n-work function layer, a p-work function layer or a conductive layer. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

In some embodiments, the conductive layer includes aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 154 is formed using chemical vapor deposition (CVD), atomic layer deposition (ALD), another suitable method, or a combination thereof.

Figure 1N:
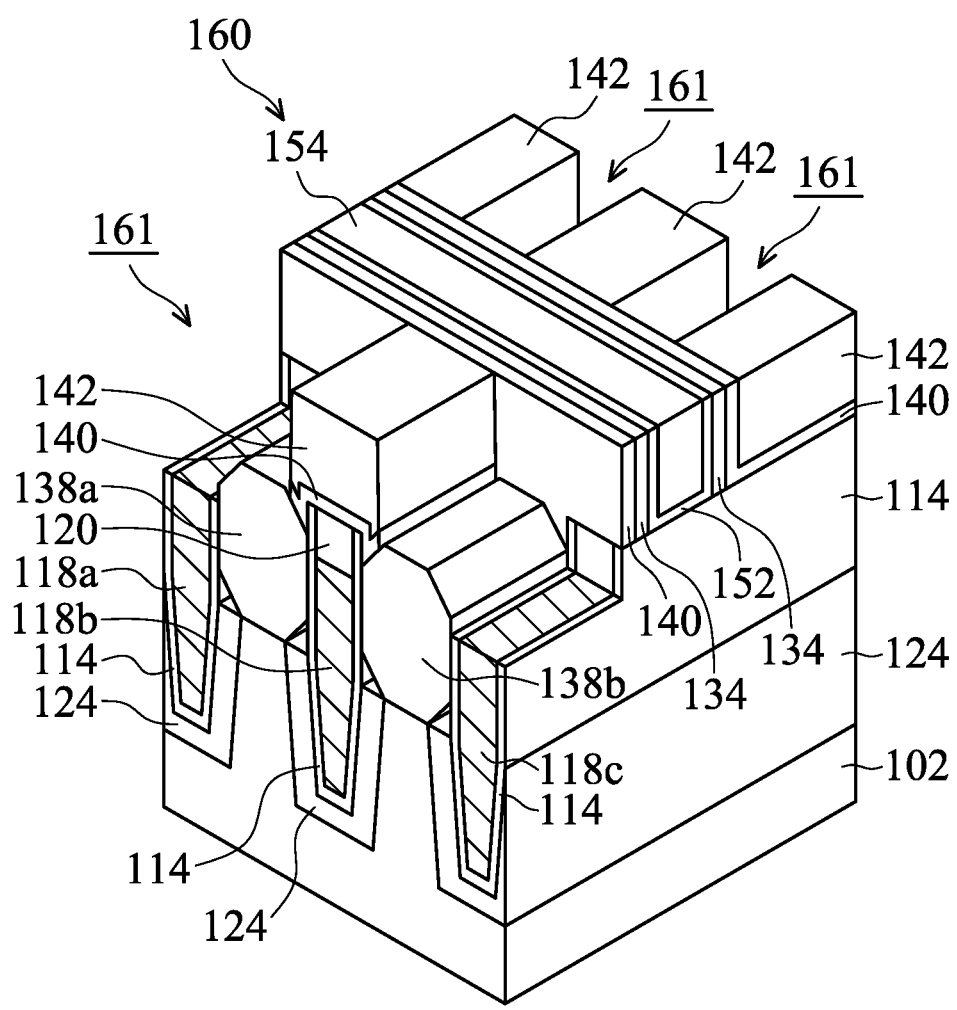

Afterwards, as shown in FIG. 1N, a portion of the ILD layer 142 is removed, a portion of the CESL 140 is removed, and a portion of the sealing layer 120 are removed, in accordance with some embodiments of the disclosure. As a result, a third recess 161 is formed to expose a portion of the first S/D structure 138a and a portion of the second S/D structure 138b. It should be noted that the portion of the sealing layer 120 is removed, but another portion of the sealing layer 120 over the second via 118b is left. In addition, the remaining CESL 140 is formed over the sealing layer 120, and the remaining ILD layer 142 is formed over the remaining CESL 140.

Figure 1O:
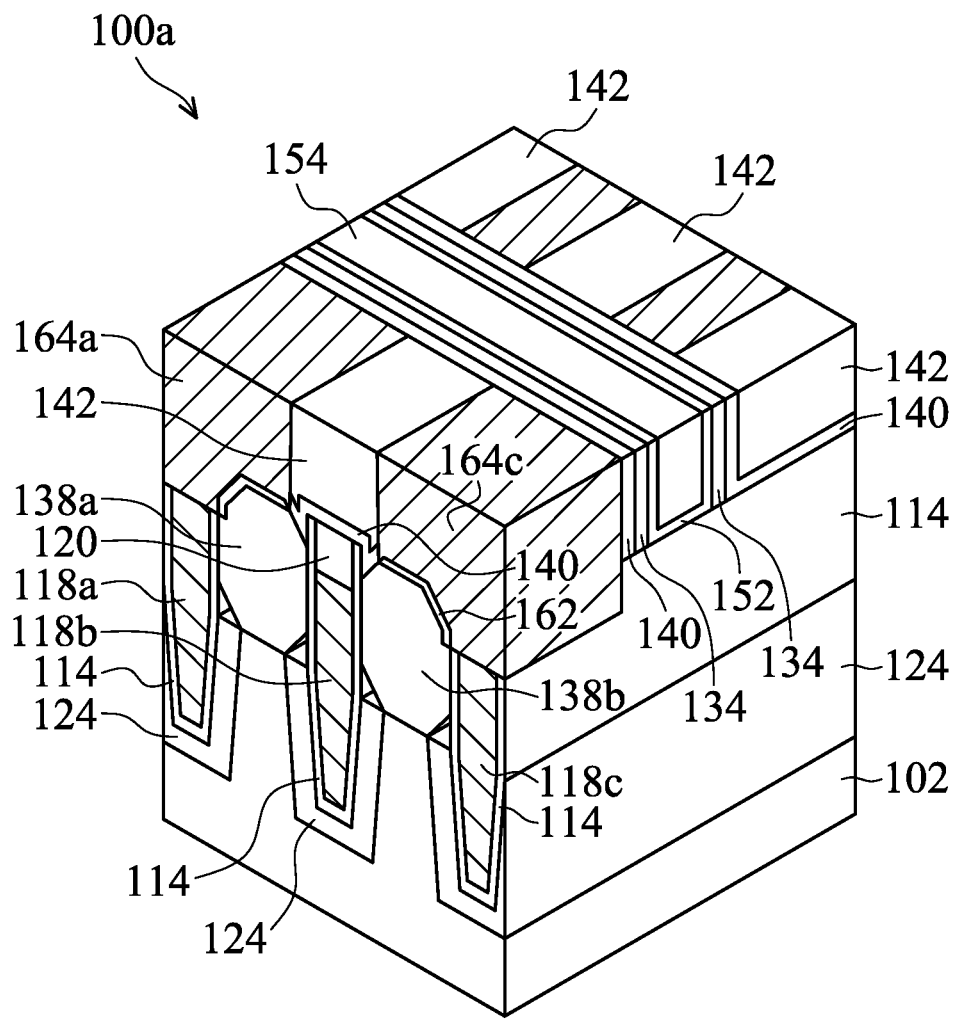

Next, as shown in FIG. 1O, a first contact structure 164a and a third contact structure 164c are formed in the third recess 161, in accordance with some embodiments of the disclosure. The first contact structure 164a is separated from the third contact structure 164c by the ILD layer 142. The first contact structure 164a is directly formed over the first S/D structure 138a, and the third contact structure 164c is directly formed over the second S/D structure 138b.

In some embodiments, a conductive material is formed in the third recess 161, and a planarization process, such as a CMP, is performed to remove excess conductive material, such that a top surface of the first contact structure 164a is substantially leveled with the top surface of the gate structure 160.

An anneal process is performed to form a silicide layer 162 at the interface between the first contact structure 164a and the first S/D structure 138a. In addition, the silicide layer 162 is also between third contact structure 164c and the second S/D structure 138b. In some embodiments, the conductive material includes copper, silver, gold, tungsten, cobalt, aluminum, nickel, or another applicable material.

Figure 1P:
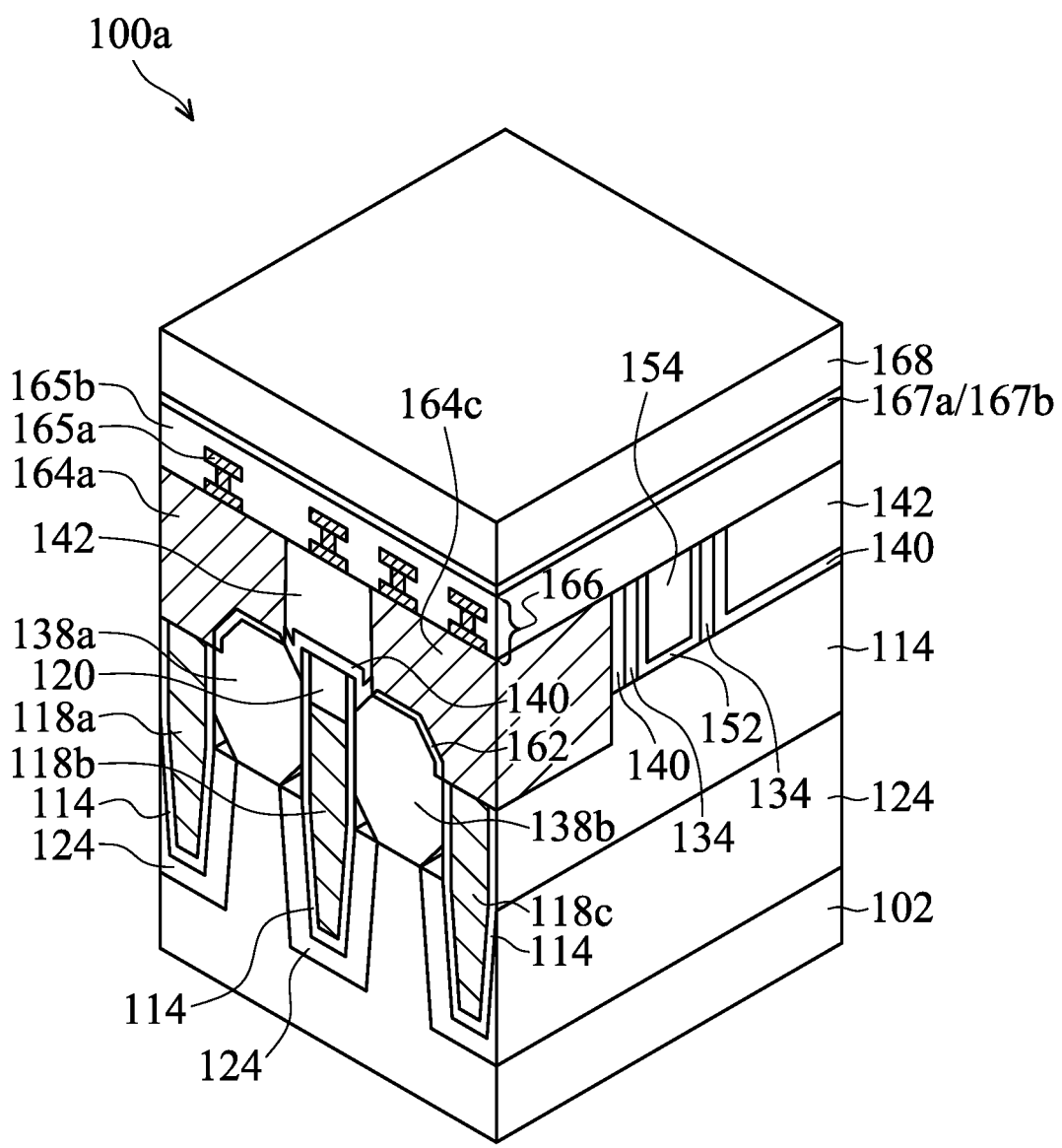

Afterwards, as shown in FIG. 1P, a first interconnect structure 166 is formed over the first contact structure 164a and the third contact structure 164c, in accordance with some embodiments of the disclosure. The first interconnect structure 166 is formed on the front side of the first via 118, and the front side of the first S/D structure 138a.

The first interconnect structure 166 includes a number of conductive layers 165a are embedded in an insulating material 165b. In some embodiments, the conductive layer 165a includes conductive materials, such as copper (Cu), copper alloy, aluminum (Al), aluminum alloy, or combinations thereof. In some embodiments, the insulating material 165b includes multiple dielectric layers of dielectric materials.

Afterwards, a carrier substrate 168 is bonded to the first interconnect structure 166, in accordance with some embodiments of the disclosure. In some embodiments, the carrier substrate 168 is bonded to the first interconnect structure 166 by a bonding process. A first bonding layer 167a is formed over the top surface of the first interconnect structure 166, and a second bonding layer 167b is formed below the bottom surface of the carrier substrate 168. The first bonding layer 167a is bonded to the second bonding layer 167b to form a dielectric-to-dielectric bonding. In some embodiments, the first bonding layer 167a and the second bonding layer 167b each includes silicon oxide. In some other embodiments, the first bonding layer 167a and the second bonding layer 167b each includes silicon oxynitride, silicon nitride, or another applicable material.

Before the bonding process, at least one of the first bonding layers 167a or the second bonding layer 167b may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to the first bonding layer 167a and/or the second bonding layer 167b.

Figure 1Q:
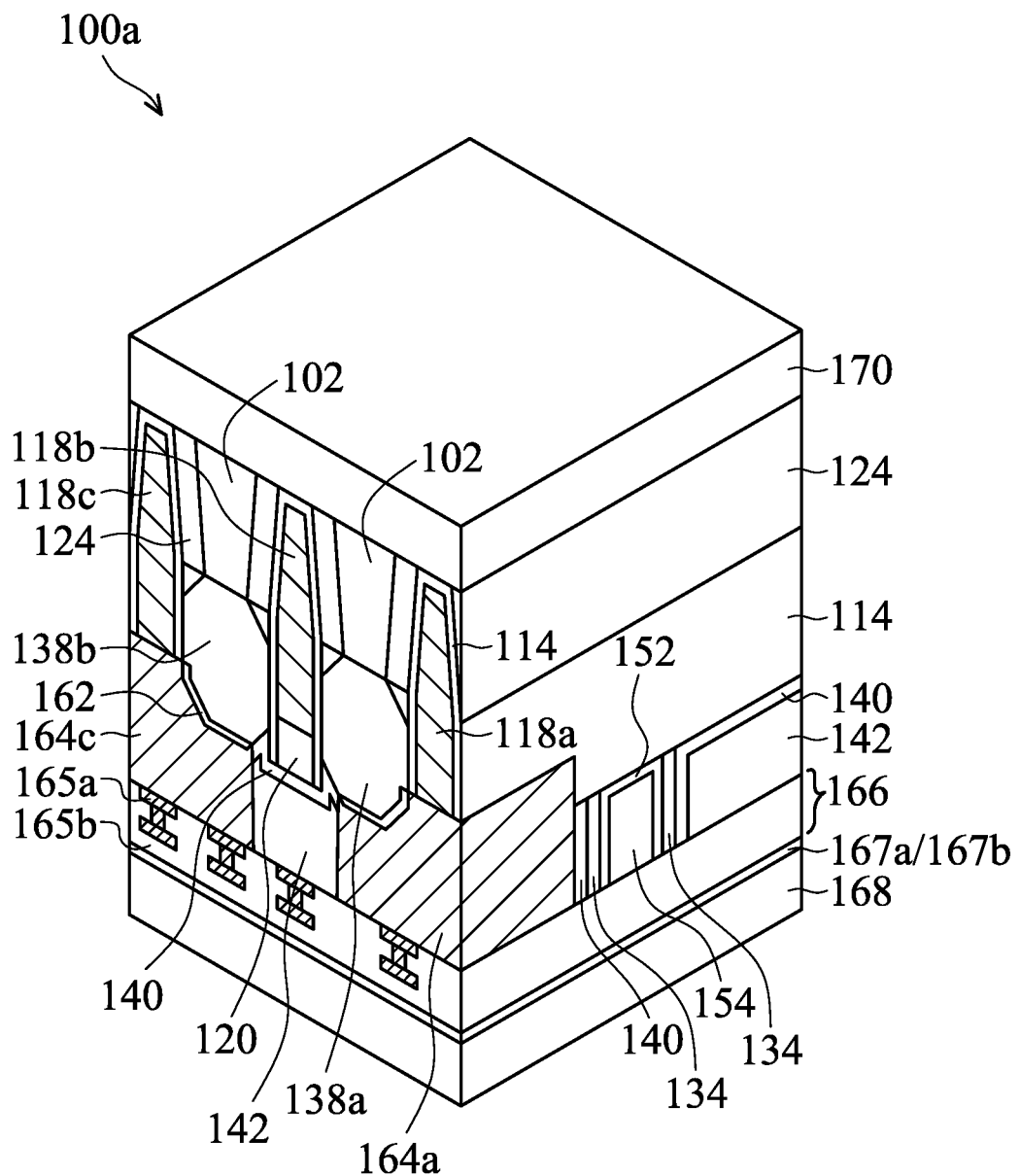

Afterwards, as shown in FIG. 1Q, the semiconductor device structure 100a is flipped over to expose the bottom surface of the substrate 102, and a portion of the substrate 102 is removed, in accordance with some embodiments of the disclosure. As a result, the isolation structure 124 is exposed. Next, an isolation dielectric layer 170 is formed over the substrate 102 and the isolation structure 124.

In some embodiments, the isolation dielectric layer 170 is made of silicon oxide, silicon nitride, silicon oxynitride, phosphosilicate glass (PSG), borophosphosilicate glass (BPSG), low-k dielectric material, and/or other applicable dielectric materials.

Figure 1R:
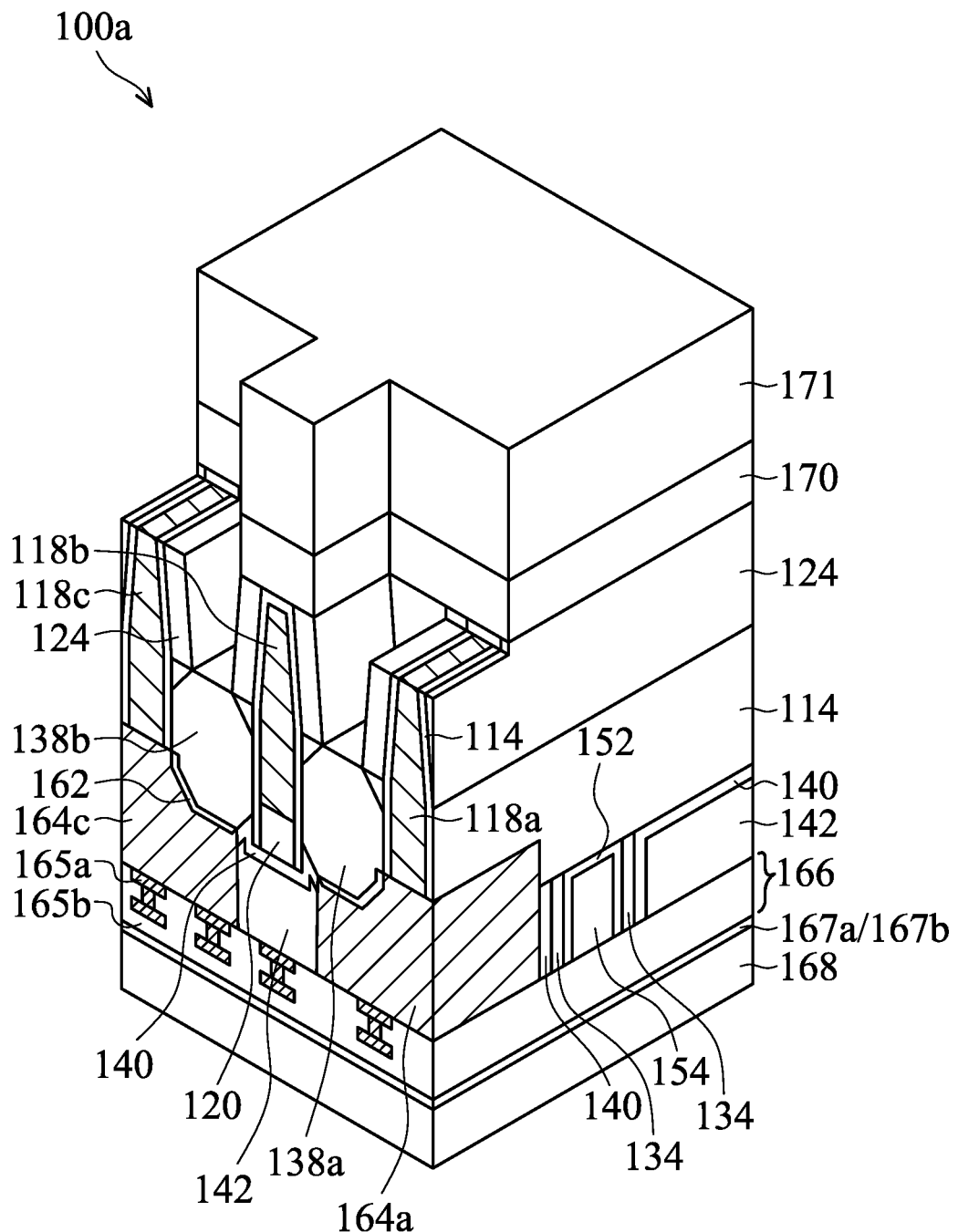

Afterwards, as shown in FIG. 1R, a photoresist material is formed over the isolation dielectric layer 170 and then patterned to form a photoresist layer 171, and a portion of the isolation dielectric layer 170 is removed to expose the substrate 102, in accordance with some embodiments of the disclosure. Afterwards, the substrate 102 is removed to expose the isolation structure 124, the second isolation material 114, the first S/D structure 138a and the second S/D structure 138b.

Figure 1S:
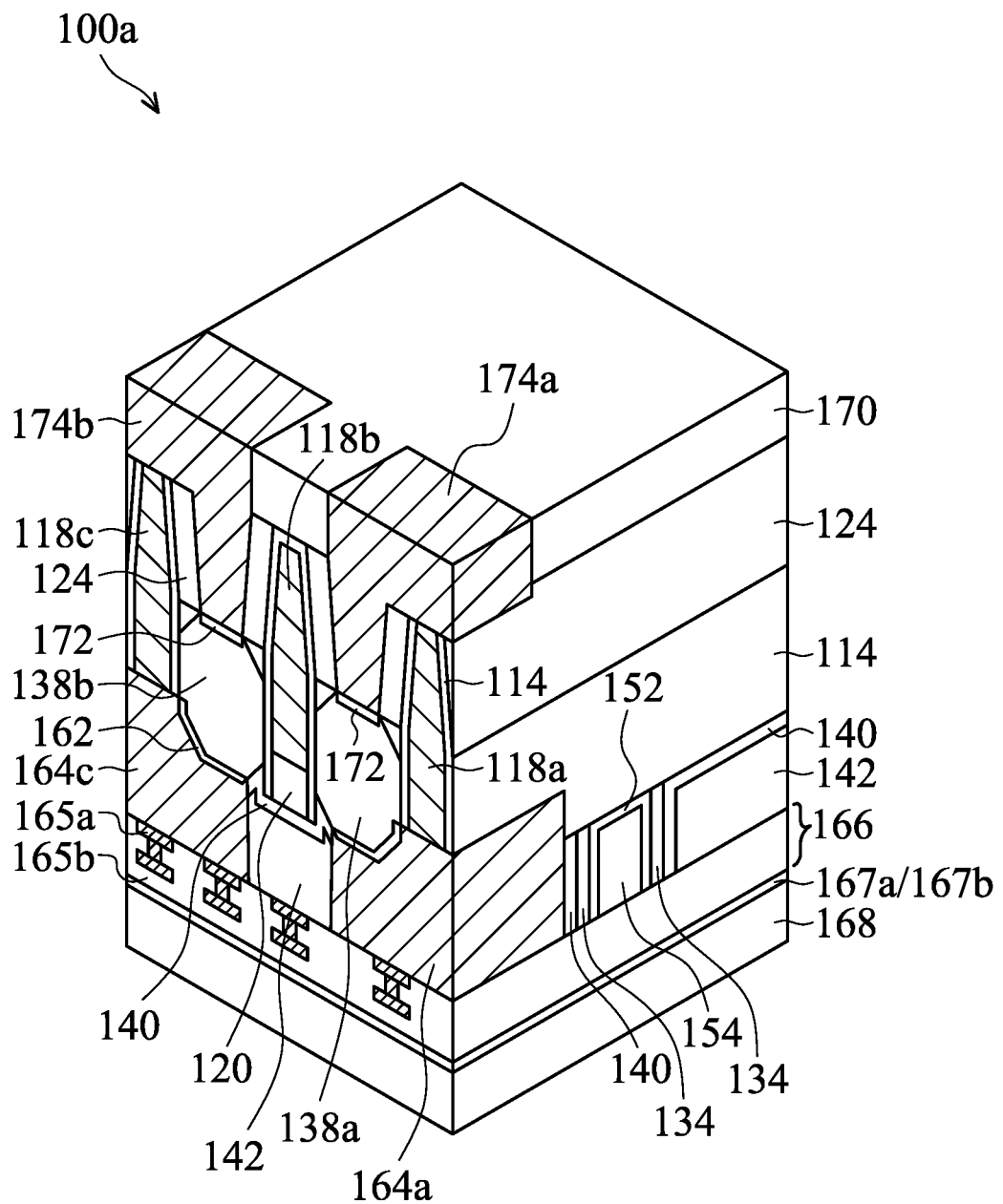
Figure 1T:
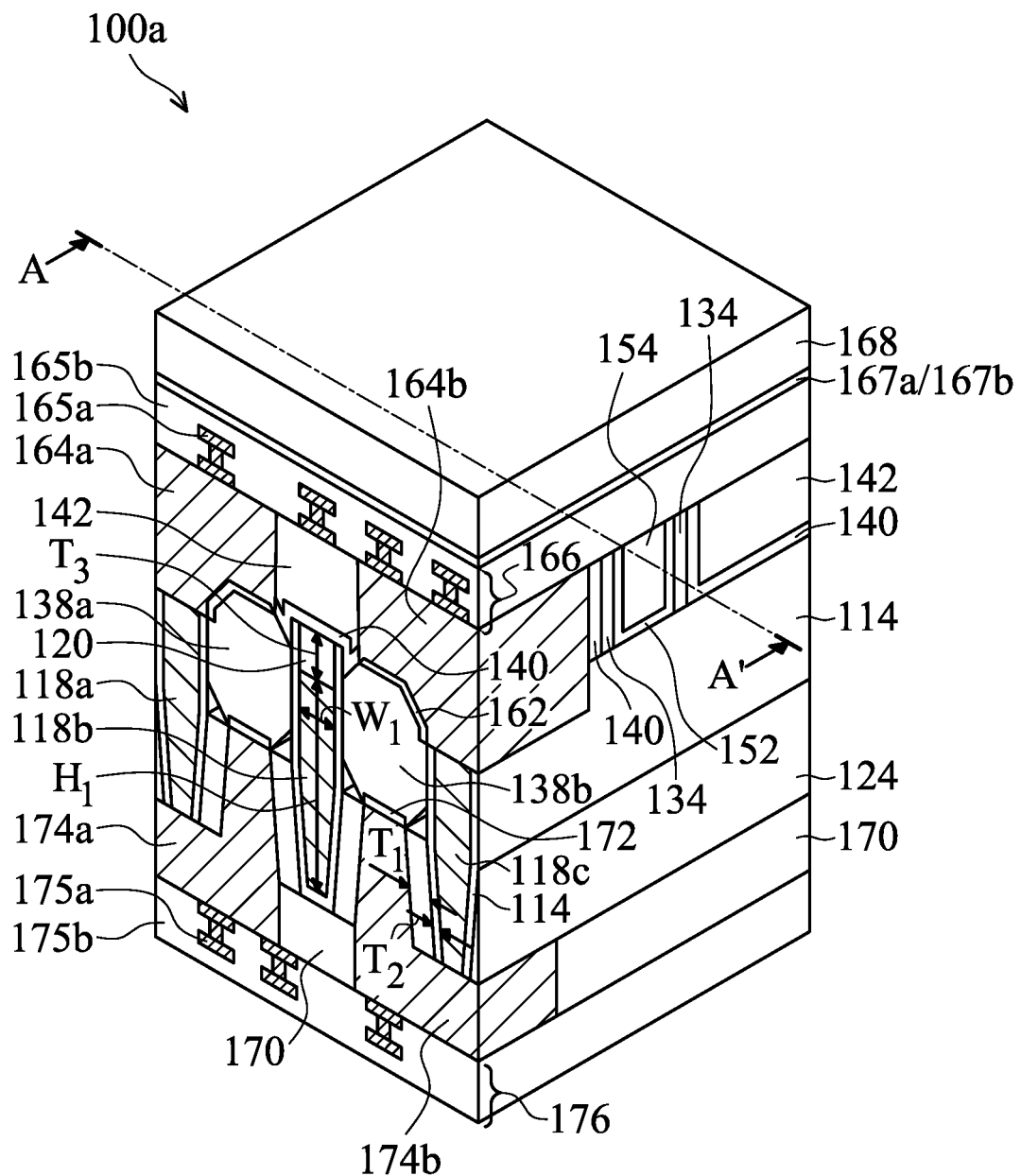
Figures 1, 1T:
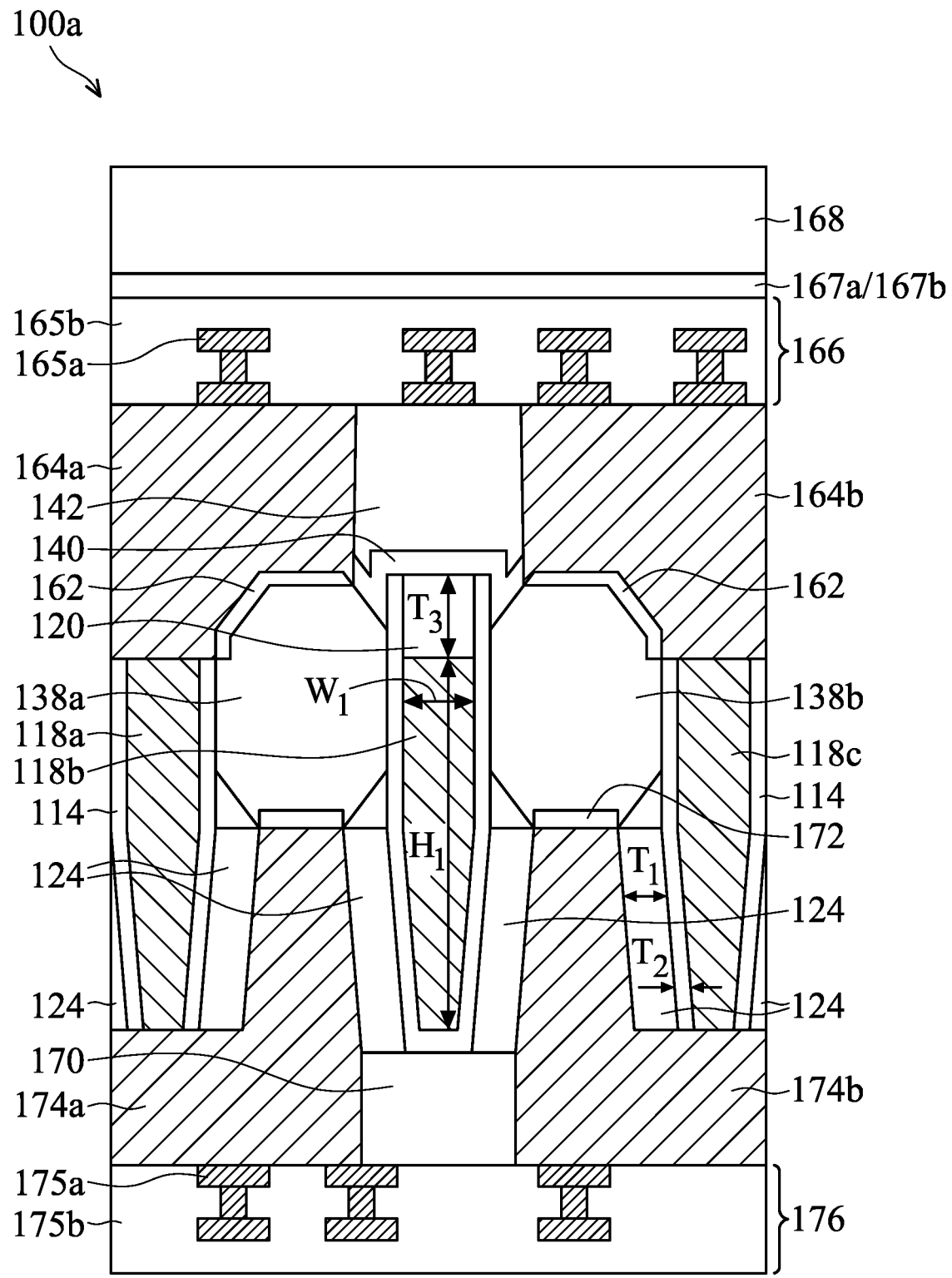

Afterwards, as shown in FIG. 1S, a second contact structure 174a is formed over the backside of the first S/D structure 138a, and a silicide layer 172 is formed between the first S/D structure 138a and the second contact structure 174a, and, in accordance with some embodiments of the disclosure. In addition, a fourth contact structure 174b is formed over the backside of the second S/D structure 138b, and the silicide layer 172 is formed between the backside of the second S/D structure 138a and the fourth contact structure 174b. The second contact structure 174a is separated from the fourth contact structure 174b by the isolation dielectric layer 170. The second contact structure 174a has a vertical portion and a horizontal portion, the vertical portion is directly below the first S/D structure 138a, and the horizontal portion is directly below the first via 118a.

Afterwards, as shown in FIG. 1T, a second interconnect structure 176 is formed over the second contact structure 174a and the fourth contact structure 174b, and then the semiconductor device structure 100a is flipped over, in accordance with some embodiments of the disclosure. The second interconnect structure 176 includes a number of conductive layers 175a are embedded in an insulating material 175b. The second interconnect structure 176 is formed on back side of the first via 118a and the back side of the first S/D structure 138a.

As shown in FIG. 1T, the first via 118a and the second via 118b are formed on opposite sides of the first S/D structure 138a, and the second via 118b and the third via 118c are formed on opposite sides of the second S/D structure 138b. The first contact structure 174a is formed on the front side of the first S/D structure 138a, and the second contact structure 174b is formed on the back side of the first S/D structure 138a. The first via 118a is in direct contact with the first contact structure 174a and the second contact structure 174b. The first contact structure 174a is formed over the first S/D structure 138a and the first via 118a, the second contact structure 174b is formed below the first S/D structure 138a and the first via 118a.

It should be noted that the first S/D structure 138a is electrically connected to the first via 118a through the first contact structure 164a or the second contact structure 174a. In addition, the second S/D structure 138b is electrically connected to the third via 118c through the third contact structure 164b or the fourth contact structure 174b. If no via is formed between the first contact structure 164a and the second contact structure 174a, the electrical connection between first contact structure 164a and the second contact structure 174a is through the first S/D contact structure 138a. By forming the first via 118a, there are two current paths. One of the current paths is through the first S/D structure 138a, and another current path is through the first via 118a. The first via 118a is formed to have an additional current path. More specifically, the first via 118a provides a current path from the front side to the back side (or vice versa). Since the first via 118a is formed by the conductive material, the resistance of the first via 118a is lower than the first S/D structure 138a. Therefore, the parasitic resistance between first contact structure 164a and the second contact structure 174a is reduced and the performance of the semiconductor device structure 100a is improved.

The first via 118a is separated from the first S/D structure 138a by the second isolation material 114. A portion of the isolation structure 124 is between the second contact structure 174b and the first via 118a. The second via 118b is surrounded by the sealing layer 120 and the second isolation material 114, and thus the second via 118 is isolated from the first S/D structure 118a and the second S/D structure 118b.

FIG. 1T-1 shows a cross-sectional representation of the semiconductor device structure 100a along line AA' shown in FIG. 1T, in accordance with some embodiments of the disclosure.

As shown in FIG. 1T-1, the second via 118b has a first width $W_1$ and the first height $H_1$. In some embodiments, the first width $W_1$ is in a range from about 8 nm to about 150 nm. In some embodiments, the first height $H_1$ is in a range from about 30 nm to about 100 nm. When the first width $W_1$ is lower than 8 nm, the resistance of second via 118b is high. When the first width $W_1$ is higher than 150 nm, the space between devices is large, inducing worse device density. When the first height $H_1$ is lower than 30 nm, the isolation between devices and the conductive layers 175a (backside metal layer) is not be enough. When the first height $H_1$ is higher than 120 nm, the resistance of second via 118b is high. In some embodiments, the isolation structure 124 has a first thickness $T_1$ the second material 114 has a second thickness $T_2$, and the sealing layer 120 has a third thickness $T_3$. In some embodiments, the first thickness $T_1$ is in a range from about 3 nm to about 15 nm. In some embodiments, the second thickness $T_2$ is in a range from about 3 nm to about 10 nm. In some embodiments, the third thickness $T_3$ is in a range from about 5 nm to about 30 nm.

Figure 2A:
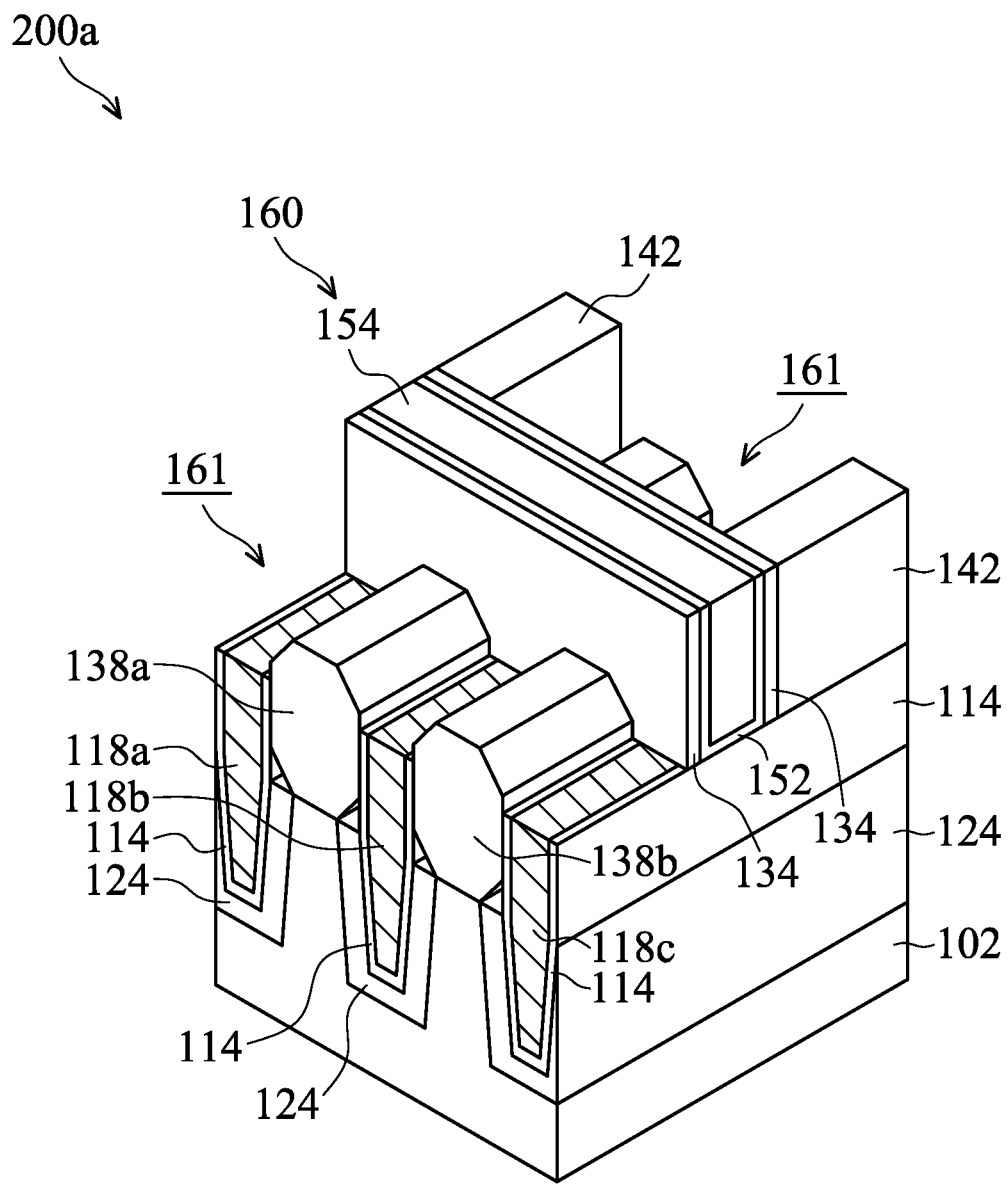
FIGS. 2A-2G show perspective representations of various stages of forming a semiconductor device structure, in accordance with some embodiments of the disclosure.
Figure 2B:
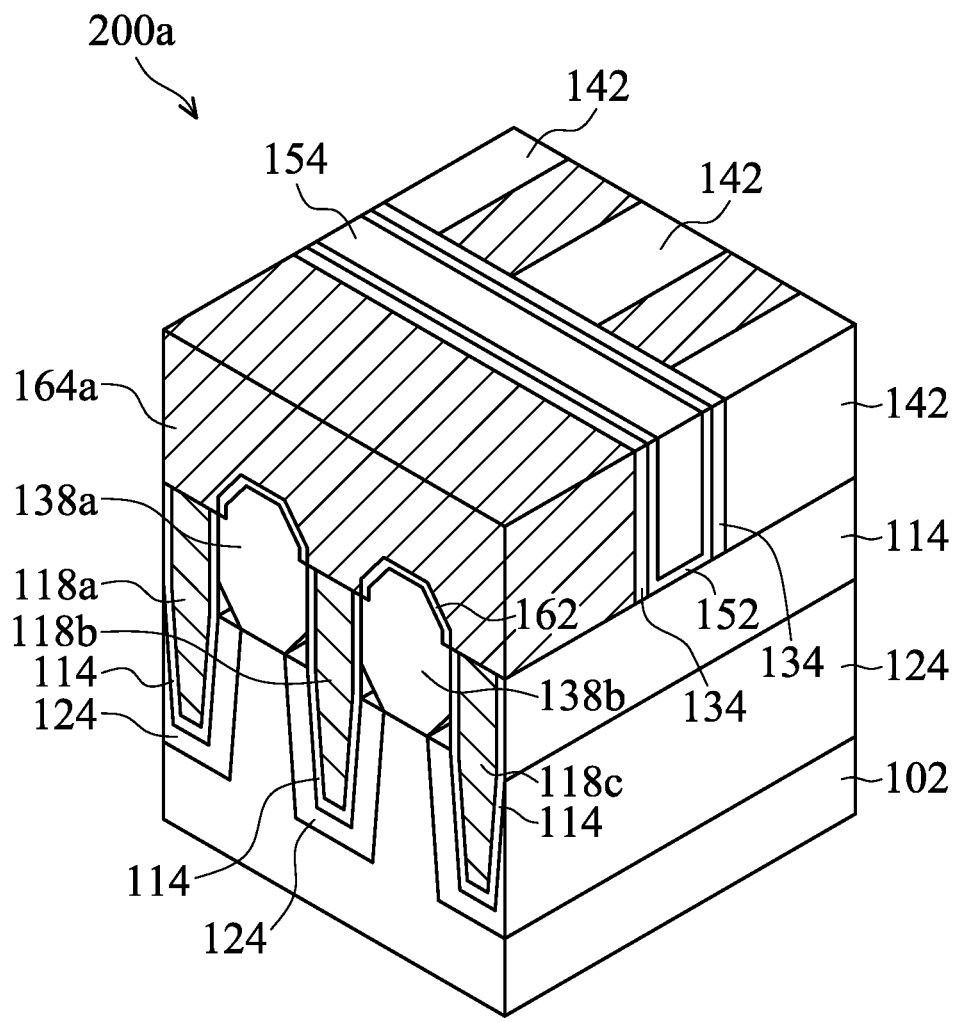
Figure 2C:
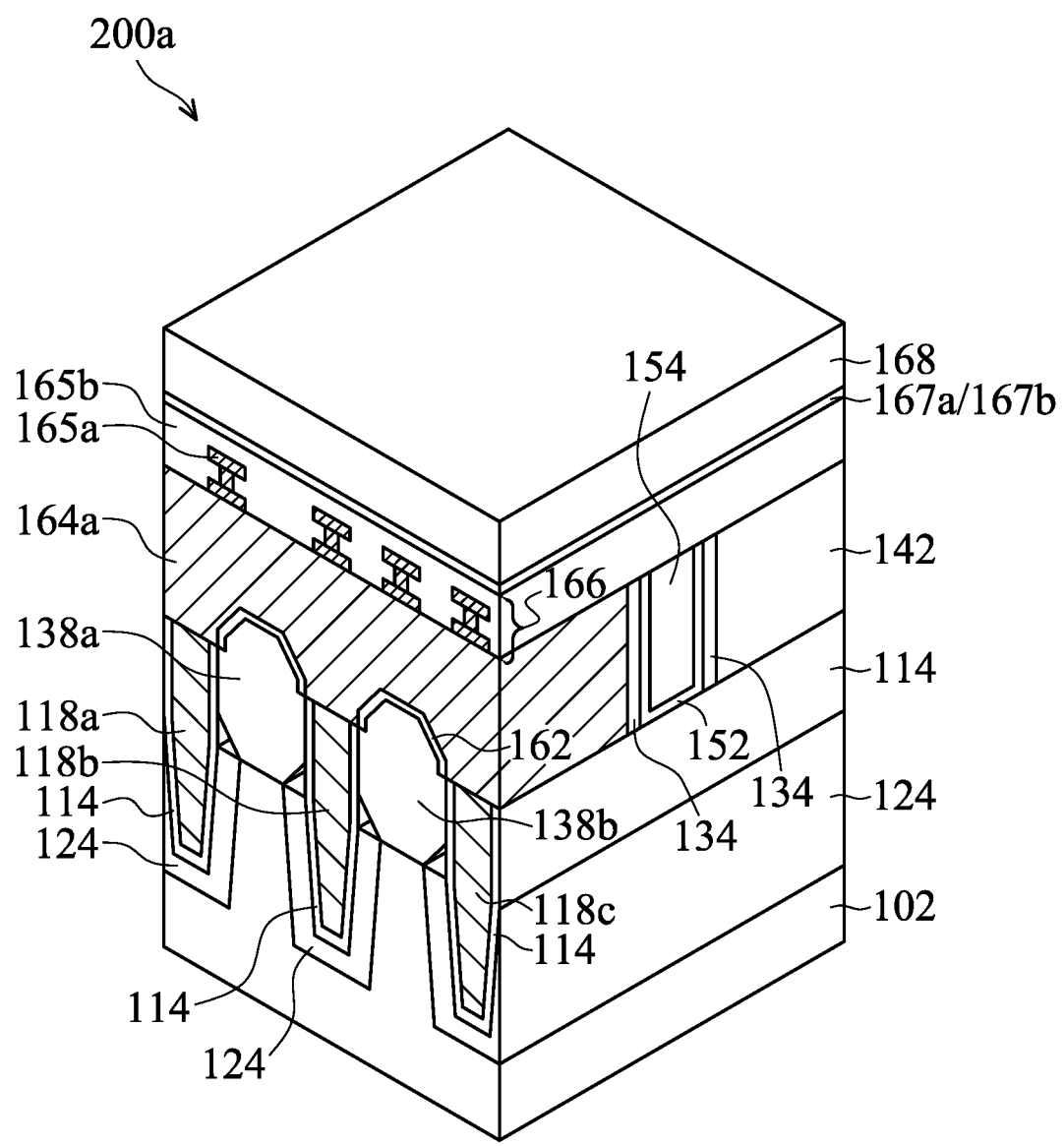
Figure 2D:
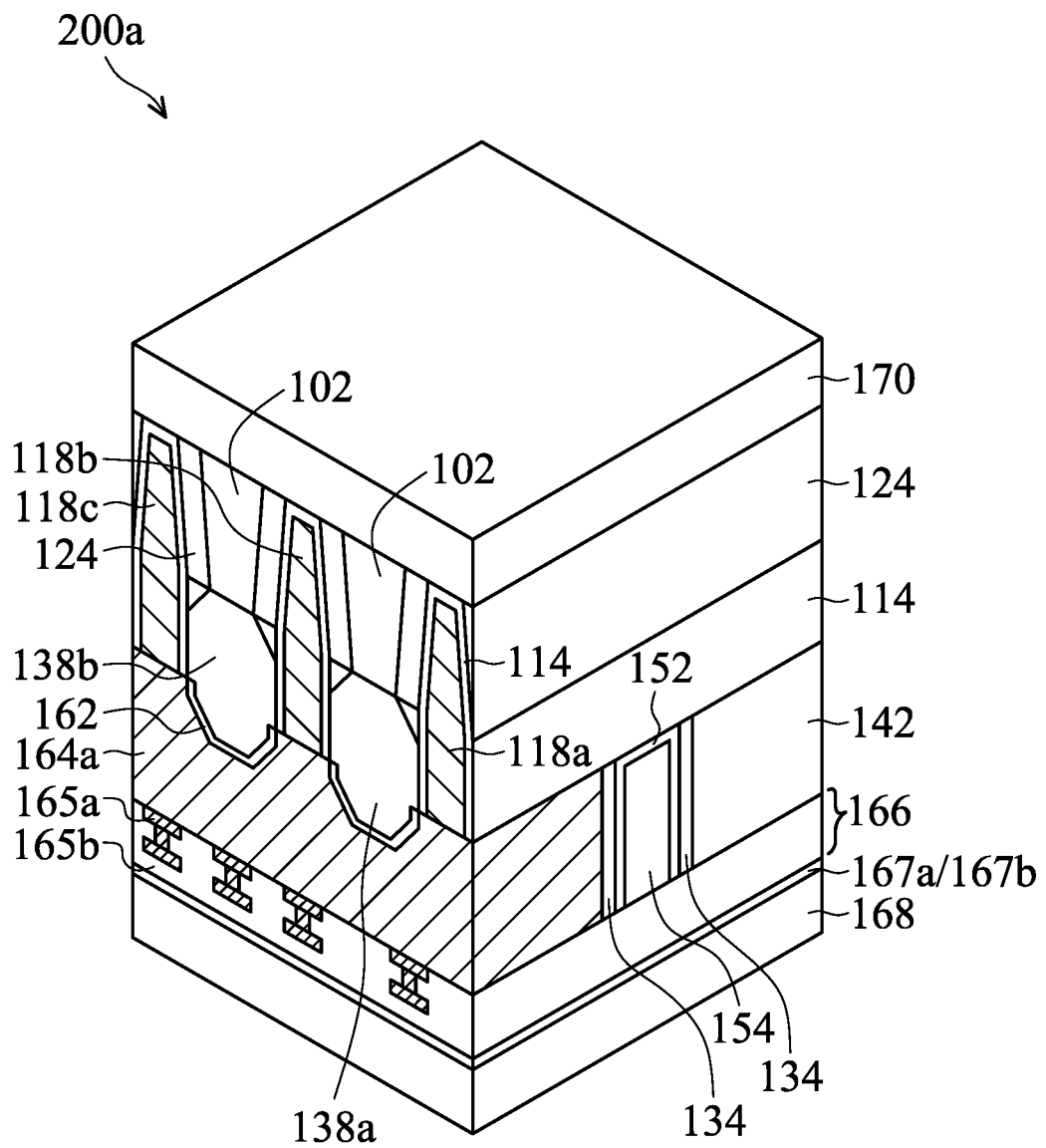
Figure 2E:
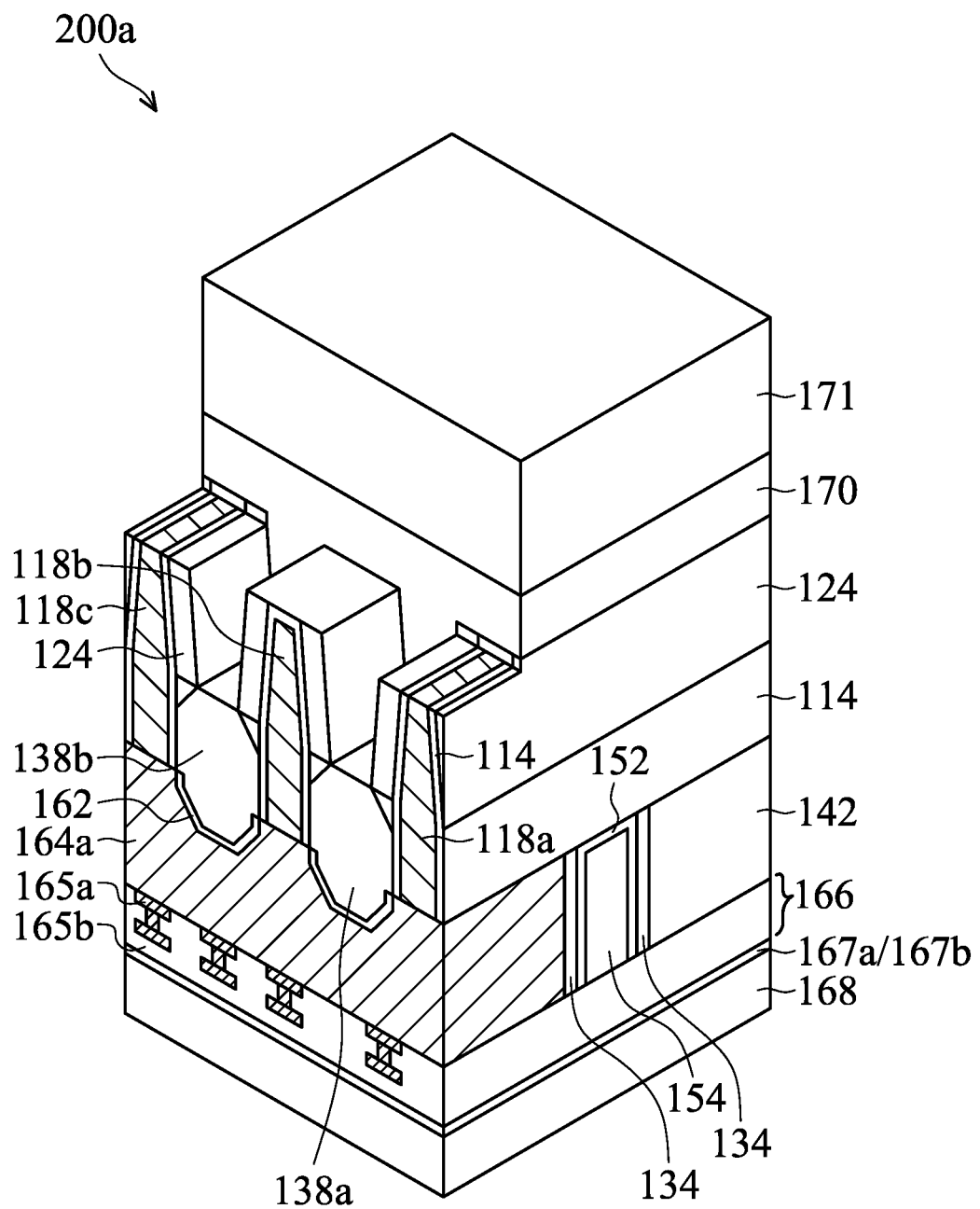
Figure 2F:
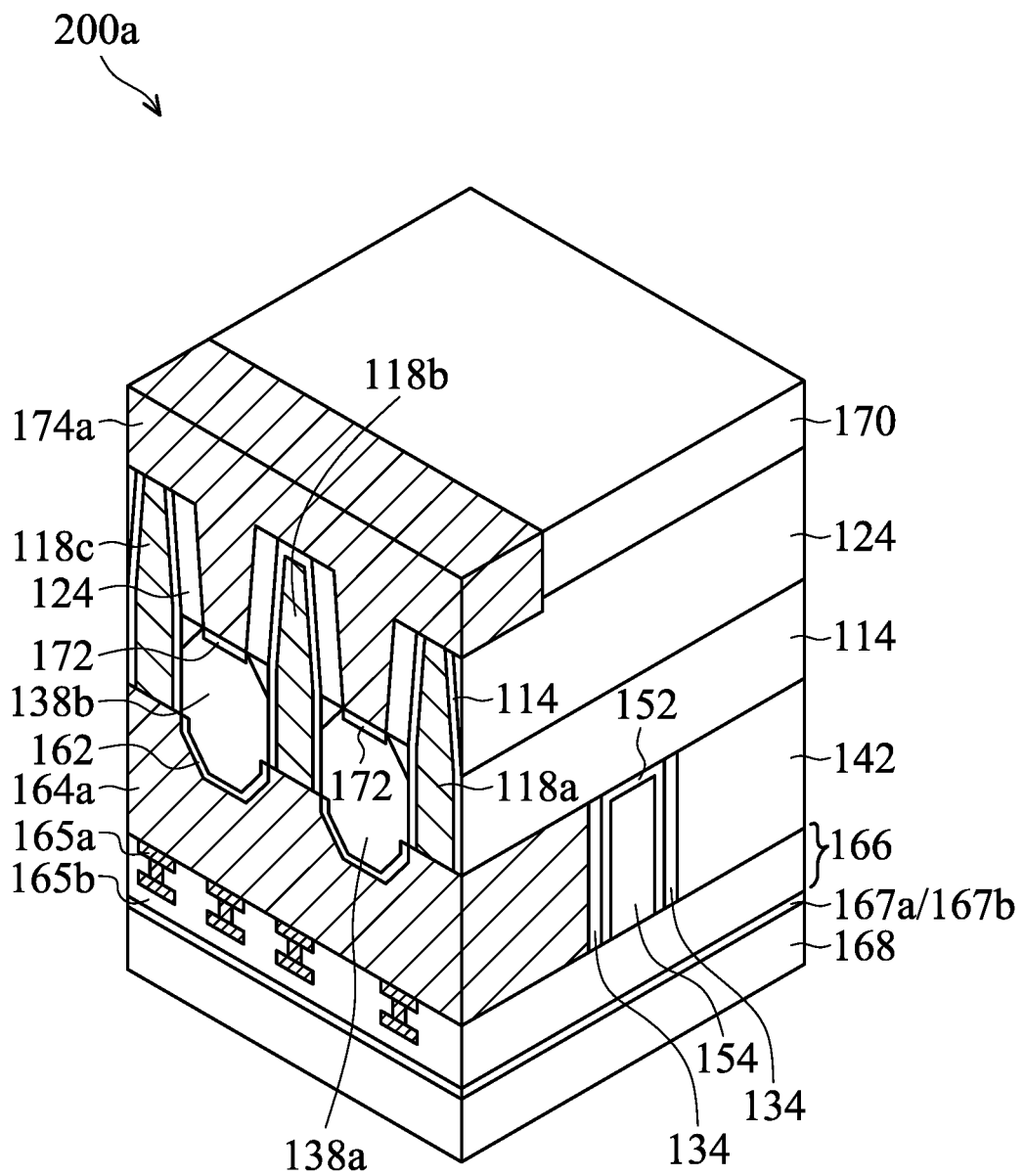
Figure 2G:
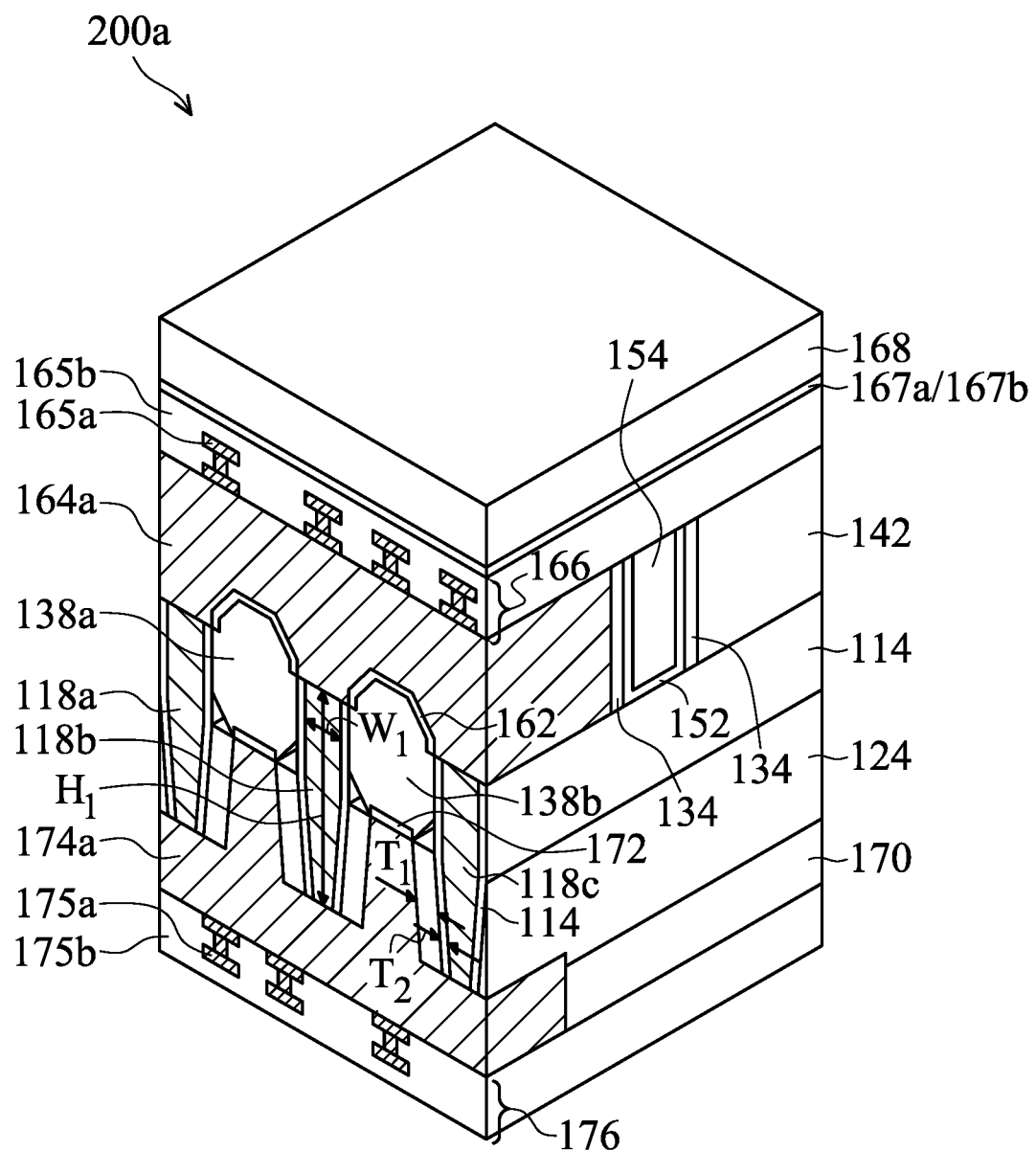

FIGS. 2A-2G show perspective representations of various stages of forming a semiconductor device structure 100b, in accordance with some embodiments of the disclosure. Some processes and materials used to form the semiconductor device structure 100b are similar to, or the same as, those used to form the semiconductor device structure 100a and are not repeated herein. The semiconductor device structure 100b of FIG. 2G is similar to the semiconductor device structure 100a of FIG. 1T, the differences between FIG. 2G and FIG. 1T are that first contact structure 164a extends from a first portion, which is over the first via 118a to a second portion, which is over the third via 118c, and the second contact structure 174a extends from a first portion, which is below the first via 118a, to a second portion, which is below the third via 118c.

As shown in FIG. 2A, the third recess 161 is formed to expose a portion of the first S/D structure 138a and a portion of the second S/D structure 138b.

Afterwards, as shown in FIG. 2B, the first contact structure 164a is formed over the silicide layer 162, and the silicide layer 162 is formed between the first S/D structure 138a and the first contact structure 164a, in accordance with some embodiments of the disclosure.

It should be noted that the first contact structure 164a is formed over the first S/D structure 138a, and formed over the second S/D structure 138b. The first contact structure 164a is in direct contact with the first via 118a, the second via 118b and the third via 118c.

Afterwards, as shown in FIG. 2C, the first interconnect structure 166 is formed over the first contact structure 164a, in accordance with some embodiments of the disclosure. Afterwards, the carrier substrate 168 is bonded to the first interconnect structure 112 through the first bonding layer 167a and the second bonding layer 167b. The first bonding layer 167a is bonded to the second bonding layer 167b to form a dielectric-to-dielectric bonding.

Afterwards, as shown in FIG. 2D, the semiconductor device structure 200a is flipped over to expose the bottom surface of the substrate 102, and a portion of the substrate 102 is removed, in accordance with some embodiments of the disclosure. As a result, the isolation structure 124 is exposed. Next, the isolation dielectric layer 170 is formed over the substrate 102 and the isolation structure 124.

Afterwards, as shown in FIG. 2E, a portion of the isolation dielectric layer 170 is removed by using the pattered photoresist layer 171 as a mask to expose the substrate 102, in accordance with some embodiments of the disclosure. Afterwards, the substrate 102 is removed to expose the isolation structure 124, the second isolation material 114, the first S/D structure 138a and the second S/D structure 138b.

Afterwards, as shown in FIG. 2F, the second contact structure 174a is formed over the backside of the first S/D structure 138a, and the silicide layer 172 is formed between the first S/D structure 138a and the second contact structure 174a, in accordance with some embodiments of the disclosure.

Afterwards, as shown in FIG. 2G, the second interconnect structure 176 is formed over the second contact structure 174a, and then the semiconductor device structure 200a is flipped over, in accordance with some embodiments of the disclosure, in accordance with some embodiments of the disclosure.

As shown in FIG. 2G, the first contact structure 164a is formed over the first via 118a, the first S/D structure 138a, the second via 118b, the second S/D structure 138b and the third via 118c. The first contact structure 164a is in direct contact with the first via 118a, the second via 118b and the third via 118c. The second contact structure 164b is formed below the first via 118a, the first S/D structure 138a, the second via 118b, the second S/D structure 138b and the third via 118c. In addition, the second contact structure 174a is in direct contact with the first via 118a, the second via 118b and the third via 118c.

The first via 118a, the second via 118b and the third via 118c are used to provide a connection between the front side contact structure (e.g. the first contact structure 164a) to the back side contact structure (the second contact structure 174a). Since the first via 118a, the second via 118b and the third via 118c are formed by the conductive material, the resistance of these conductive vias is lower than that of the first S/D structure 138a. Therefore, the parasitic resistance between the first contact structure 164a and the second contact structure 174a is reduced.

Embodiments for forming a semiconductor device structure and method for formation the same are provided. The semiconductor structure includes a fin structure, the fin structure includes a number of the nanostructures stacked in the vertical direction. The gate structure formed over the fin structure, and a first S/D structure adjacent to the gate structure. A first via and a second via are on opposite sides of the first S/D structure. A first contact structure formed over the first S/D structure, and a second contact structure formed below the first S/D structure. The first via is in direct contact with the first contact structure and the second contact structure. The first contact structure is electrically connected to the second contact structure through the first S/D structure or the first via. Since the first via is formed by a conductive material, the resistance of the first via is lower than that of the first S/D structure. Therefore, by forming the first via, the parasitic resistance between the first contact structure and the second contact structure is reduced and the performance of the semiconductor device structure is improved.

In some embodiments, a semiconductor device structure is provided. The semiconductor device structure includes a fin structure formed over a substrate, and the fin structure includes a plurality of nanostructures stacked in a vertical direction. The semiconductor device structure includes a gate structure formed over the fin structure, and an S/D structure formed adjacent to the gate structure. The semiconductor device structure includes a first via formed adjacent to the S/D structure, and a first contact structure formed over the S/D structure. The semiconductor device structure includes a second contact structure formed below the S/D structure, and the first via is in direct contact with the first contact structure and the second contact structure.

In some embodiments, a semiconductor device structure is provided. The semiconductor device structure includes a fin structure formed over a substrate, and the fin structure comprises a plurality of first nanostructures stacked in a vertical direction. The semiconductor device structure includes a first S/D structure formed over the fin structure, and a first via and a second via formed on opposite sides of the first S/D structure. The first via and the second via are separated from the first S/D structure by an isolation material. The semiconductor device structure includes a first contact structure formed on the first via, and a second contact structure formed below the first via. The first contact structure is electrically connected to the second contact structure by the first S/D structure or the first via.

In some embodiments, a method for forming a semiconductor device structure is provided. The method includes forming a first stacked nanostructure, and forming a first via adjacent to the first stacked nanostructure. The method includes forming a dummy gate structure over the first stacked nanostructure and the first via, and removing a portion of the first stacked nanostructure to form a trench. The method also includes forming a first S/D structure in the trench, and forming a first contact structure over the first S/D structure. The method further includes forming a second contact structure below the first S/D structure, and the first via is in direct contact with the first contact structure and the second contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a plurality of nanostructures stacked in a vertical direction;
a gate structure formed over the nanostructures;
an S/D structure formed adjacent to the gate structure;
a first via formed adjacent to the S/D structure, wherein a topmost surface of the S/D structure is higher than a topmost surface of the first via, and the first via is filled with a conductive layer;
a first contact structure formed over the S/D structure, wherein a portion of the first contact structure is lower than a top surface of the S/D structure; and
a second contact structure formed below the S/D structure, wherein the first via is in direct contact with the first contact structure and the second contact structure, and
wherein an entirety of the gate structure is higher than an entirety of the first via, and wherein the first contact structure is electrically connected to the second contact structure by the S/D structure or the first via.

2. The semiconductor device structure as claimed in claim 1, further comprising:
a first silicide layer formed over the S/D structure, wherein the first silicide layer is between the S/D structure and the first contact structure.

3. The semiconductor device structure as claimed in claim 1, further comprising:
an isolation material formed over a sidewall surface of the first via, wherein the S/D structure is separated from the first via by the isolation material.

4. The semiconductor device structure as claimed in claim 1, further comprising:
a second via formed adjacent to the S/D structure; and
a sealing layer formed over the second via.

5. The semiconductor device structure as claimed in claim 4, wherein the first contact structure is in direct contact with the second via.

6. The semiconductor device structure as claimed in claim 1, wherein the second contact structure has a vertical portion and a horizontal portion, the vertical portion is directly below the S/D structure, and the horizontal portion is directly below the first via.

7. The semiconductor device structure as claimed in claim 1, further comprising:
a first interconnect structure formed over the first contact structure; and
a second interconnect structure formed below the second contact structure.

8. The semiconductor device structure as claimed in claim 1, further comprising:
an isolation structure formed over a substrate, wherein a portion of the isolation structure is between the second contact structure and the first via.

9. A semiconductor device structure, comprising:
a plurality of first nanostructures stacked in a vertical direction;
a first S/D structure formed over the first nanostructures;
a gate structure adjacent to the first S/D structure;
a first via and a second via formed on opposite sides of the first S/D structure, wherein the first via and the second via are separated from the first S/D structure by an isolation material, and a topmost surface of the second via is higher than a topmost surface of the first via;
a first contact structure formed on the first via;
a second contact structure formed below the first via, wherein the first contact structure is electrically connected to the second contact structure by the first S/D structure or the first via; and
a backside silicide layer in direct contact with a back-side surface of the first S/D structure, wherein the backside silicide layer is in direct contact with the second contact structure,
wherein a bottom surface of the gate structure is higher than a top surface of the first via and lower than a top surface of the second via, and wherein an entirety of the gate structure is higher than an entirety of the first via.

10. The semiconductor device structure as claimed in claim 9, further comprising:
a second S/D structure formed over a substrate;
a third contact structure formed over the second S/D structure; and
a fourth contact structure formed below the second S/D structure, wherein the first contact structure is separated from the third contact structure, and the second contact structure is separated from the fourth contact structure.

11. The semiconductor device structure as claimed in claim 9, wherein the first contact structure is in direct contact with the second via.

12. The semiconductor device structure as claimed in claim 9, further comprising:
a sealing layer formed over the second via; and
an etching stop layer formed over the sealing layer.

13. The semiconductor device structure as claimed in claim 9, further comprising:
a first silicide layer formed over the first S/D structure, wherein the first silicide layer is between the first S/D structure and the first contact structure.

14. The semiconductor device structure as claimed in claim 9, wherein the second contact structure comprises a vertical portion and a horizontal portion, the vertical portion is directly below the first S/D structure, and the horizontal portion is directly below the first via.

15. The semiconductor device structure as claimed in claim 9, further comprising:
a first interconnect structure formed over the first contact structure; and
a second interconnect structure formed below the second contact structure.

16. A semiconductor device structure, comprising:
a plurality of nanostructures stacked in a vertical direction;
a gate structure formed over the nanostructures;
an S/D structure formed adjacent to the gate structure;
a first via formed adjacent to the S/D structure;
a first contact structure formed over the S/D structure, wherein a portion of the first contact structure is lower than a top surface of the S/D structure;
a second contact structure formed below the S/D structure, wherein the first via is in direct contact with the first contact structure and the second contact structure;
a second via formed adjacent to the S/D structure;
a sealing layer formed on the second via, wherein a sidewall surface of the sealing layer is aligned with a sidewall surface of the second via, and an entirety of a bottommost surface of the sealing layer covers an entirety of a topmost surface of the second via; and
an etching stop layer formed over the second via, wherein a portion of the etching stop layer is lower than a top surface of the S/D structure, and
an isolation material surrounding the second via and the sealing layer, wherein an outermost sidewall surface of the sealing layer is in direct contact with an inner sidewall surface of the isolation material, wherein an entirety of the gate structure is higher than an entirety of the first via, and wherein the first contact structure is electrically connected to the second contact structure by the S/D structure or the first via.

17. The semiconductor device structure as claimed in claim 16, further comprising:
a silicide layer formed on the S/D structure, wherein the silicide layer is in direct contact with the etching stop layer.

18. The semiconductor device structure as claimed in claim 16,
wherein the isolation material is formed over a sidewall surface and a bottom surface of the second via, and wherein the isolation material has an U-shaped structure.

19. The semiconductor device structure as claimed in claim 16, wherein a portion of the first contact structure is lower than a topmost surface of the S/D structure.

20. The semiconductor device structure as claimed in claim 1, wherein a topmost surface of the gate structure is higher than a topmost surface of the first via.

* * * * *